(12) United States Patent
Lee

(10) Patent No.: US 9,899,099 B2
(45) Date of Patent: Feb. 20, 2018

(54) ELECTRONIC DEVICE INCLUDING FUSE ELEMENT HAVING THREE OR MORE JUNCTIONS FOR REDUCED AREA AND IMPROVED DEGREE OF INTEGRATION

(71) Applicant: SK hynix Inc., Icheon (KR)

(72) Inventor: Hyung-Dong Lee, Icheon (KR)

(73) Assignee: SK HYNIX INC., Icheon (KR)

( * ) Notice: Subject to any disclaimer, the term of this patent is extended or adjusted under 35 U.S.C. 154(b) by 321 days.

(21) Appl. No.: 14/693,827

(22) Filed: Apr. 22, 2015

(65) Prior Publication Data

US 2016/0180960 A1 Jun. 23, 2016

(30) Foreign Application Priority Data

Dec. 18, 2014 (KR) .................. 10-2014-0183212

(51) Int. Cl.
*G11C 17/18* (2006.01)
*G11C 17/16* (2006.01)
*G06F 13/16* (2006.01)
*H01L 27/112* (2006.01)

(52) U.S. Cl.
CPC .......... *G11C 17/16* (2013.01); *G06F 13/1673* (2013.01); *G11C 17/18* (2013.01); *H01L 27/11206* (2013.01)

(58) Field of Classification Search
None
See application file for complete search history.

(56) References Cited

U.S. PATENT DOCUMENTS

| 2013/0039117 | A1 | 2/2013 | Lin et al. |
| 2016/0086679 | A1 | 3/2016 | Lee |
| 2016/0189800 | A1* | 6/2016 | Ryu ........................ G11C 29/76 365/96 |

FOREIGN PATENT DOCUMENTS

| KR | 10-0585629 B1 | 5/2006 |
| KR | 10-2012-0037371 A | 4/2012 |
| KR | 10-2016-0035836 A | 4/2016 |
| WO | WO 2010/147029 A1 | 12/2010 |

* cited by examiner

*Primary Examiner* — Son Dinh
*Assistant Examiner* — Sultana Begum

(57) ABSTRACT

A fuse element includes a gate; first to Nth junction regions disposed in an active region, where N is a natural number of 3 or more; and a dielectric layer interposed between the gate and the first to Nth junction regions, wherein a dielectric breakdown between the gate and each of the first to Nth junction regions is independently performed.

22 Claims, 14 Drawing Sheets

ELECTRONIC DEVICE INCLUDING FUSE ELEMENT HAVING THREE OR MORE JUNCTIONS FOR REDUCED AREA AND IMPROVED DEGREE OF INTEGRATION

CROSS-REFERENCE TO RELATED APPLICATION

This patent document claims priority of Korean Patent Application No. 10-2014-0183212, entitled "FUSE UNIT, SEMICONDUCTOR MEMORY INCLUDING THE FUSE UNIT, AND ELECTRONIC DEVICE INCLUDING THE SEMICONDUCTOR MEMORY" and filed on Dec. 18, 2014, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device can have a reduced area and an improved degree of integration using a fuse element having three or more junctions.

In one aspect, a fuse element includes a gate; first to Nth junction regions disposed in an active region, where N is a natural number of 3 or more; and a dielectric layer interposed between the gate and the first to Nth junction regions, wherein a dielectric breakdown between the gate and each of the first to Nth junction regions is independently performed.

Implementations of the above fuse element may include one or more the following.

The gate has a polygonal shape which has N numbers of sides overlapping with the active region, and the first to Nth junction regions are disposed in the active region to correspond to the N numbers of sides, respectively. The polygonal shape is a concave polygonal shape or a convex polygonal shape. At least a portion of the gate laterally protrudes out of the active region in a plan view and is disposed over the active region. The fuse element further comprising: N numbers of first switches having first ends which are coupled to the first to Nth junction regions, respectively. The fuse element further comprising: N numbers of second switches having first ends coupled to second ends of the N numbers of first switches, respectively, and second ends coupled to a ground voltage end.

In another aspect, an electronic device includes semiconductor memory, and the semiconductor memory includes first to Nth coupling lines coupled to first ends of first to Nth memory cells, respectively, where N is a natural number of 3 or more; first to Nth spare lines coupled to first ends of first to Nth spare cells, respectively, wherein the first to Nth spare cells correspond to the first to Nth memory cells, respectively; a driving block for selectively driving the first to Nth coupling lines with a predetermined voltage; and a repair coupling block for selectively coupling the first to Nth coupling lines with the first to Nth spare lines according to whether any of the first to Nth memory cells is a failure memory cell or not, wherein the repair coupling block includes a fuse, the fuse including a gate commonly coupled to the first to Nth coupling lines, first to Nth junction regions coupled to the first to Nth spare lines, respectively, and a dielectric layer interposed between the gate and the first to Nth junction regions, and wherein a dielectric breakdown between the gate and each of the first to Nth junction regions is independently performed.

The gate has a polygonal shape which has N numbers of sides overlapping with an active region, and the first to Nth junction regions are disposed in the active region to correspond to the N numbers of sides, respectively. The polygonal shape is a concave polygonal shape or a convex polygonal shape. At least a portion of the gate laterally protrudes out of the active region in a plan view and is disposed over the active region. When a Tth memory cell of the first to Nth memory cells is a failure memory cell, the repair coupling block couples a Tth coupling line with a Tth spare line by causing a dielectric breakdown between the gate and a Tth junction region, where T is a natural number in a range of 1 to N. The repair coupling block further includes first to Nth switches coupled to and disposed between the first to Nth junction regions and the first to Nth spare lines, respectively, and wherein, when the Tth memory cell is selected after the dielectric breakdown occurs between the gate and the Tth junction region, a Tth switch is turned on. The repair coupling block further includes N numbers of first switches coupled to and disposed between the first to Nth junction regions and the first to Nth spare lines, respectively, and N numbers of second switches having first ends each coupled to and disposed between a corresponding one of the first to Nth spare lines and a corresponding one of the first to Nth switches and second ends coupled to a ground voltage end, and wherein, while the dielectric breakdown occurs between the gate and the Tth junction region, a Tth first switch and a Tth second switch are turned on. The semiconductor memory further includes: first to Nth additional coupling lines coupled to second ends of the first to Nth memory cells, respectively, and extending in a direction which crosses an extending direction of the first to Nth coupling lines; first to Nth additional spare lines coupled to second ends of the first to Nth spare cells, respectively, and extending in a direction which crosses an extending direction of the first to Nth spare lines; an additional driving block for driving the first to Nth additional spare lines with a predetermined voltage; and an additional repair coupling block for selectively coupling the first to Nth additional coupling lines with the first to Nth additional spare lines according to whether any of the first to Nth memory cells is a failure memory cell or not. When a Tth memory cell of the first to Nth memory cells is a failure memory cell, the additional repair coupling block blocks a connection between a Tth additional coupling line and a Tth additional spare line, where T is a natural number in a range of 1 to N. The additional repair coupling block further includes first to Nth additional switches coupled to and disposed between the first to Nth additional coupling lines and the first to Nth additional spare lines, respectively, and wherein, when the Tth memory cell is selected, a Tth additional switch is turned off. Each of the first to Nth memory cells and the first to Nth spare cells includes a variable resistance element which switches between different resistance states according to a voltage or current supplied thereto through a corresponding one of the first to Nth coupling lines and a corresponding one of the first to Nth additional coupling lines.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

These and other aspects, implementations and associated advantages are described in greater detail in the drawings, the description and the claims.

DETAILED DESCRIPTION

Figure 1:
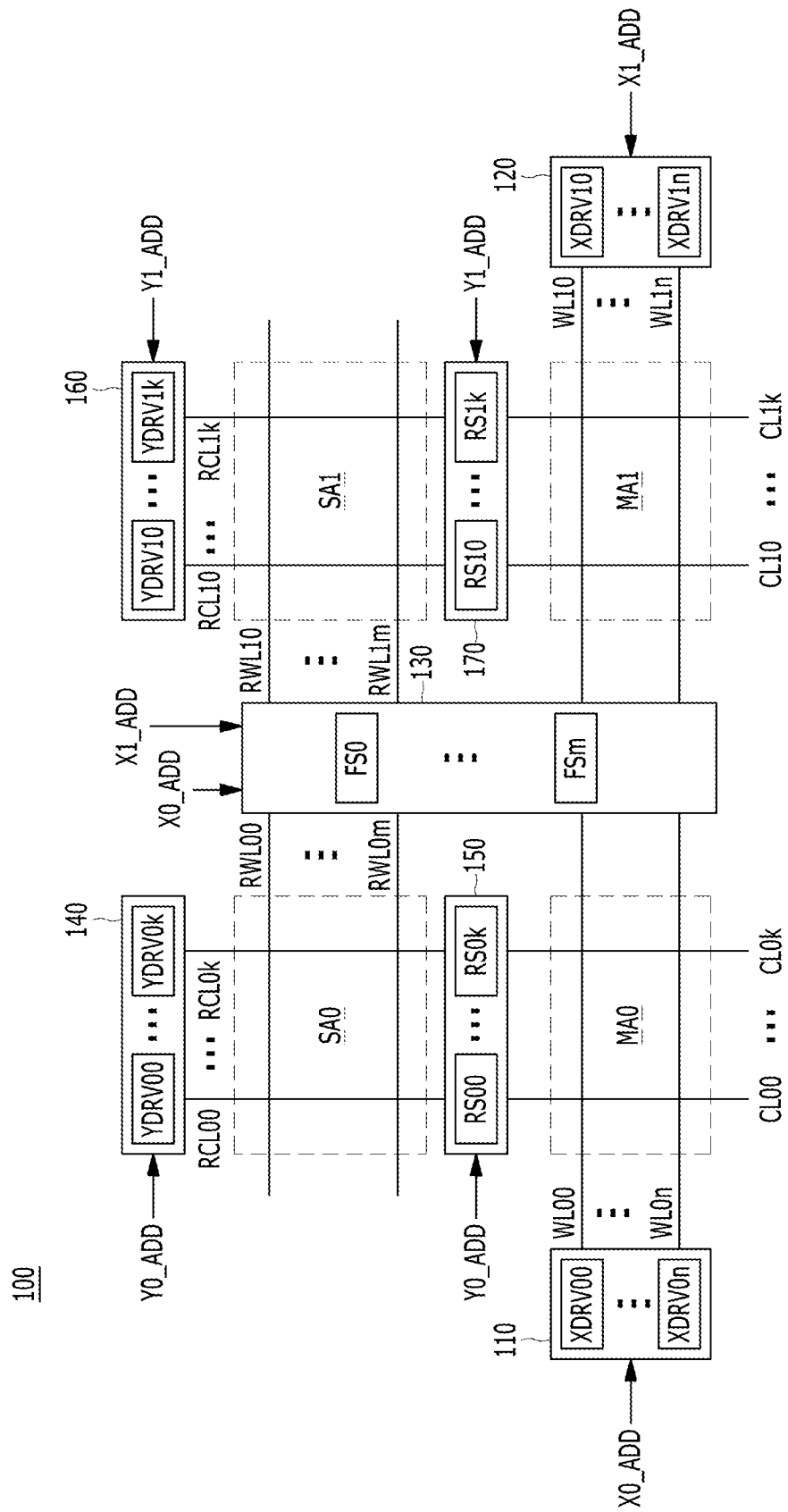
FIG. 1 is a view illustrating a memory circuit in accordance with an implementation.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Prior to the description of the drawings, a memory circuit in accordance with an implementation may include two or more memory areas and two or more spare areas which correspond to the two or more memory areas, respectively. Each of the memory areas may include a plurality of memory cells. Each of the spare areas may include a plurality of spare cells to be replaced with failure memory cells among memory cells of a corresponding memory area. A memory area may have a cross point array structure in which memory cells are disposed at cross points of crossing lines. Similarly, a spare area may have a cross point array structure in which spare cells are disposed at cross points of crossing lines.

Each memory cell may include a variable resistance element as a memory element. The variable resistance element may switch between different resistance states according to a voltage or current supplied thereto through two crossing lines, in order to store different data. The variable resistance element may have a single-layered structure or a multi-layered structure including various materials used in an RRAM, a PRAM, an FRAM, an MRAM and the like. The various materials may include a transition metal oxide, a metal oxide such as a perovskite-based material, a phase change material such as a chalcogenide-based material, a ferroelectric material, a ferromagnetic material, etc. Furthermore, each of the memory cells may include an access element. The access element is coupled to the variable resistance element and controls an access to the variable resistance element. The access element may include any of a diode, a transistor, a varistor, an MIT (Metal-Insulator Transition) element, a tunnel barrier, an ovonic switching element, etc.

Hereinafter, memory circuits according to implementations will be described with reference to the drawings.

FIG. 1 is a view illustrating a memory circuit 100 in accordance with an implementation. The memory circuit 100 includes two memory areas and two spare areas which correspond to the two memory areas, respectively.

Referring to FIG. 1, the memory circuit 100 may include a first memory area MA0, a first spare area SA0, a first row driving block 110, a second memory area MA1, a second spare area SA1, a second row driving block 120, a row coupling block 130, a first column driving block 140, a first column coupling block 150, a second column driving block 160, and a second column coupling block 170.

The first memory area MA0 may include memory cells of a first group that are located at cross points where normal row lines WL00 to WL0$n$ of the first group intersect with normal column lines CL00 to CL0$k$ of the first group, n and k being positive integers. The first spare area SA0 may include spare cells of the first group that are located at cross points where spare row lines RWL00 to RWL0$m$ of the first group intersect with spare column lines RCL00 to RCL0$k$ of the first group, m being a positive integer. The first row driving block 110 may selectively enable the normal row lines WL00 to WL0$n$ of the first group based on a first row address X0_ADD.

The second memory area MA1 may include memory cells of a second group that are located at cross points where normal row lines WL10 to WL1$n$ of the second group intersect with normal column lines CL10 to CL1$k$ of the second group. The second spare area SA1 may include spare cells of the second group that are located at cross points where spare row lines RWL10 to RWL1$m$ of the second group intersect with spare column lines RCL10 to RCL1$k$ of the second group. The second row driving block 120 may selectively enable the normal row lines WL10 to WL1$n$ of the second group based on a second row address X0_ADD.

The row coupling block 130 may selectively couple the normal row lines WL00 to WL0$n$ of the first group with the spare row lines RWL00 to RWL0$m$ of the first group based on the first row address X0_ADD, and selectively couple the normal row lines WL10 to WL1$n$ of the second group with the spare row lines RWL10 to RWL1$m$ of the second group based on the second row address X1_ADD.

The first column driving block 140 may selectively enable the spare column lines RCL00 to RCL0$k$ of the first group based on a first column address Y0_ADD. The first column coupling block 150 may selectively couple the spare column lines RCL00 to RCL0$k$ of the first group with the normal column lines CL00 to CL0$k$ of the first group based on the first column address Y0_ADD.

The second column driving block 160 may selectively enable the spare column lines RCL10 to RCL1$k$ of the second group based on a second column address Y1_ADD. The second column coupling block 170 may selectively couple the spare column lines RCL10 to RCL1$k$ of the second group with the normal column lines CL10 to CL1$k$ of the second group based on the second column address Y1_ADD.

Each of the memory cells of the first group included in the first memory area MA0 may include a variable resistance element and an access element, which have been described above. As a normal row line and a corresponding normal column line are enabled, predetermined data may be written in each of the memory cells of the first group in a write operation, or predetermined data may be read out of each of the memory cells of the first group in a read operation.

The spare cells of the first group included in the first spare area SA0 may be redundancy memory cells to be replaced with memory cells that have defects, among the memory cells of the first group. A memory cell having defects will be referred to as a "failure memory cell." On the other hand, a memory cell that does not have a defect and operates normally will be referred to as a "normal memory cell." The spare cells of the first group may have substantially the same structures as the memory cells of the first group. For example, when each of the memory cells of the first group includes a variable resistance element, each of the spare cells of the first group may also include a variable resistance element.

The first row driving block 110 may selectively drive the normal row lines WL00 to WL0$n$ of the first group with a first voltage when a memory cell of the first group is selected. For example, when a first memory cell, which is disposed at a cross point of the normal row line WL00 among the normal row lines WL00 to WL0n of the first group and the normal column line CL00 among the normal column lines CL00 to CL0k of the first group, is selected, the first row driving block 110 may drive the first normal row line WL00 with the first voltage. The first memory cell may be accessed to perform a write operation for writing data in the first memory cell or a read operation for reading data from the first memory cell. The first row driving block 110 may include row driving units XDRV00 to XDRV0n of the first group for driving a normal row line corresponding to the first row address X0_ADD among the normal row lines WL00 to WL0n of the first group.

Each of the memory cells of the second group included in the second memory area MA1 may include a variable resistance element and an access element, which have been described above. As a normal row line and a corresponding normal column line are enabled, predetermined data may be written in each of the memory cells of the second group in a write operation, or predetermined data may be read out of each of the memory cells of the second group in a read operation.

The spare cells of the second group included in the second spare area SA1 may be redundancy memory cells to be replaced with failure memory cells among the memory cells of the second group. The spare cells of the second group may have substantially the same structures as the memory cells of the second group.

The second row driving block 120 may selectively drive the normal row lines WL10 to WL1n of the second group with the first voltage when a memory cell of the second group is selected. For example, when a second memory cell, which is disposed at a cross point of the normal row line WL10 among the normal row lines WL10 to WL1n of the second group and the normal column line CL10 among the normal column lines CL10 to CL1k of the second group, is selected, the second row driving block 120 may drive the second normal row line WL10 with the first voltage. The second memory cell may be accessed to perform a write operation for writing data in the second memory cell or a read operation for reading data from the second memory cell. The second row driving block 120 may include row driving units XDRV10 to XDRV1n of the second group for driving a normal row line corresponding to the second row address X1_ADD among the normal row lines WL10 to WL1n of the second group.

The row coupling block 130 may selectively couple the normal row lines WL00 to WL0n of the first group with the spare row lines RWL00 to RWL0m of the first group according to whether a selected memory cell of the first group is a failure memory cell or not. For example, if the first memory cell coupled to the normal row line WL00 and the normal column line CL00 is selected and the first memory cell is a failure memory cell, the row coupling block 130 may couple the normal row line WL00 to the spare row line RWL00 so that a first spare cell coupled with the spare row line RWL00 among the spare row lines RWL00 to RWL0m of the first group and the spare column line RCL00 among the spare column lines RCL00 to RCL0k of the first group may replace the first memory cell. On the other hand, if the first memory cell is selected and the first memory cell is not a failure memory cell, i.e., the first memory cell is a normal memory cell, the row coupling block 130 may not couple the normal row line WL00 to the spare row line RWL00.

Also, the row coupling block 130 may selectively couple the normal row lines WL10 to WL1n of the second group with the spare row lines RWL10 to RWL1m of the second group according to whether a selected memory cell of the second group is a failure memory cell or not. For example, if the second memory cell, coupled to the normal row line WL10 and the normal column line CL10, is selected and the second memory cell is a failure memory cell, the row coupling block 130 may couple the normal row line WL10 to the spare row line RWL10 so that a second spare cell, which is coupled to the spare row line RWL10, among the spare row lines RWL10 to RWL1m of the second group, and coupled to the spare column line RCL10, among the spare column lines RCL10 to RCL1k of the second group, may replace the second memory cell. On the other hand, if the second memory cell is selected and the second memory cell is not a failure memory cell, the row coupling block 130 may not couple the normal row line WL10 to the spare row line RWL10.

Meanwhile, the row coupling block 130 may include a plurality of common row coupling units FS0 to FSm for selectively coupling the normal row lines WL00 through WL0n of the first group to the spare row lines RWL00 through RWL0m of the first group, and for selectively coupling the normal row lines WL10 to WL1n of the second group and the spare row lines RWL10 to RWL1m of the second group. The number of the normal row lines WL00 to WL0n of the first group, the number of the normal row lines WL10 to WL1n of the second group, the number of the spare row lines RWL00 to RWL0m of the first group, and the number of the spare row lines RWL10 to RWL1m of the second group may be the same (n=m), or the number of the normal row lines WL00 to WL0n of the first group and the number of the normal row lines WL10 to WL1n of the second group may be greater than the number of the spare row lines RWL00 to RWL0m of the first group and the number of the spare row lines RWL10 to RWL1m of the second group (n>m).

The first column driving block 140 may selectively drive the spare column lines RCL00 to RCL0k of the first group with a second voltage, when a memory cell of the first group is selected. For example, the first column driving block 140 may drive a first spare column line RCL00 with the second voltage, when the first memory cell is selected.

The first column coupling block 150 may selectively couple the spare column lines RCL00 to RCL0k of the first group with the normal column lines CL00 to CL0k of the first group according to whether a selected memory cell of the first group is a failure memory cell or not. For example, if the first memory cell is selected and the first memory cell is a failure memory cell, the first column coupling block 150 may not couple the spare column line RCL00 to the normal column line CL00. This is to apply the second voltage only to the spare column line RCL00 so that the first spare cell is accessed instead of the first memory cell. Conversely, if the first memory cell is selected and the first memory cell is not a failure memory cell, the first column coupling block 150 may couple the spare column line RCL00 to the normal column line CL00. Thus, the second voltage applied to the spare column line RCL00 is applied to the normal column line CL00, as well. Meanwhile, the first column coupling block 150 may include column coupling units RS00 to RS0k of the first group to couple each of the normal column lines CL00 to CL0k of the first group with a corresponding one of the spare column lines RCL00 to RCL0k of the first group.

The second column driving block 160 may selectively drive the spare column lines RCL10 to RCL1k of the second group with the second voltage, when a memory cell of the second group is selected. For example, the second column driving block 160 may drive the spare column line RCL10 with the second voltage, when the second memory cell is selected.

The second column coupling block 170 may selectively couple the spare column lines RCL10 to RCL1$k$ of the second group with the normal column lines CL10 to CL1$k$ of the second group according to whether a selected memory cell of the second group is a failure memory cell or not. For example, if the second memory cell is selected and the second memory cell is a failure memory cell, the second column coupling block 170 may not couple the spare column line RCL10 to the normal column line CL10. Thus, the second voltage is applied only to the spare column line RCL10 so that the second spare cell is accessed instead of the second memory cell. Conversely, if the second memory cell is selected and the second memory cell is not a failure memory cell, the second column coupling block 170 may couple the spare column line RCL10 to the normal column line CL10. Thus, the second voltage is applied to the spare column line RCL10 to the normal column line CL10, as well. Meanwhile, the second column coupling block 170 may include column coupling units RS10 to RS1$k$ of the second group to couple each of the normal column lines CL10 to CL1$k$ of the second group with a corresponding one of the spare column lines RCL10 to RCL1$k$ of the second group.

An operating method of the memory circuit 100 in FIG. 1 will be described in more detail with reference to FIG. 2.

Figure 2:
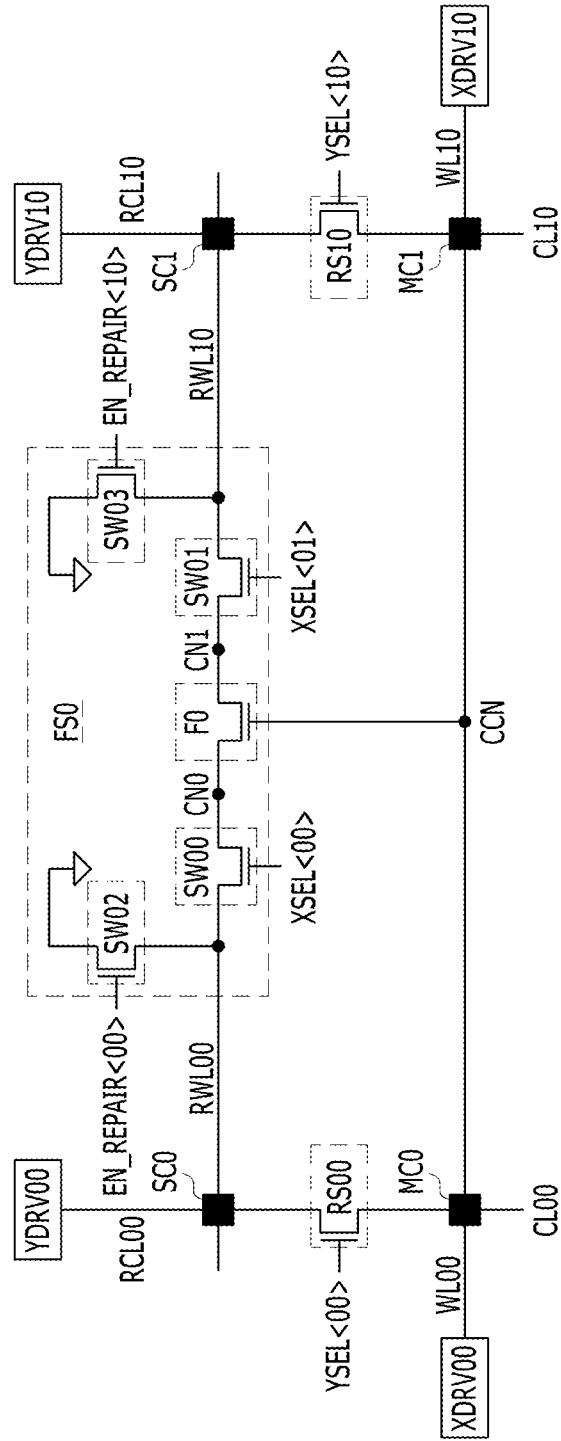
FIG. 2 is a view illustrating a portion of the memory circuit shown in FIG. 1 in accordance with an implementation.

FIG. 2 is a view illustrating a portion of the memory circuit 100 shown in FIG. 1. For the sake of convenience of description, only parts of components shown in FIG. 1 are shown in FIG. 2. Also, in FIG. 2, a case where the normal row lines WL00 to WL0$n$ of the first group and the spare row lines RWL00 to RWL0$m$ of the first group are formed one-to-one, and the normal row lines WL10 to WL1$n$ of the second group and the spare row lines RWL10 to RWL1$m$ of the second group are formed one-to-one is shown as an example (n=m). However, implementations are not limited thereto.

Referring to FIG. 2, the memory circuit 100 may include a first memory cell MC0, a first spare cell SC0, a first row driving unit XDRV00, a second memory cell MC1, a second spare cell SC1, a second row driving unit XDRV10, a first common row coupling unit FS0, a first column driving unit YDRV00, a first column coupling unit RS00, a second column driving unit YDRV10, and a second column coupling unit RS10.

The first memory cell MC0 is disposed at a cross point of the first normal row line WL00 and the first normal column line CL00. The first spare cell SC0 is disposed at a cross point of the first spare row line RWL00 and the first spare column line RCL00. The first row driving unit XDRV00 drives the first normal row line WL00 with the first voltage when the first memory cell MC0 is accessed.

The second memory cell MC1 is disposed at a cross point of the second normal row line WL10 and the second normal column line CL10. The second spare cell SC1 is disposed at a cross point of the second spare row line RWL10 and the second spare column line RCL10. The second row driving unit XDRV10 drives the second normal row line WL10 with the first voltage when the second memory cell MC1 is selected.

The first common row coupling unit FS0 selectively couples the first normal row line WL00 to the first spare row line RWL00 according to whether the first memory cell MC0 is a failure memory cell or not when the first memory cell MC0 is selected, The first common row coupling unit FS0 selectively couples the second normal row line WL10 to the second spare row line RWL10 according to whether the second memory cell MC1 is a failure memory cell or not when the second memory cell MC1 is selected.

The first column driving unit YDRV00 drives the first spare column line RCL00 with the second voltage when the first memory cell MC0 is selected. The first column coupling unit RS00 selectively couples the first spare column line RCL00 to the first normal column line CL00 according to whether the first memory cell MC0 is a failure memory cell or not when the first memory cell MC0 is selected.

The second column driving unit YDRV10 drives the second spare column line RCL10 with the second voltage when the second memory cell MC1 is selected. The second column coupling unit RS10 selectively couples the second spare column line RCL10 to the second normal column line CL10 according to whether the second memory cell MC1 is a failure memory cell or not when the second memory cell MC1 is selected.

Particularly, the first common row coupling unit FS0 may include a fuse F0, a first switch SW00, a second switch SW01, a third switch SW02, and a fourth switch SW03. The fuse F0 is coupled to and disposed between the first normal row line WL00 and a first access node CN0, and disposed between the second normal row line WL10 and a second access node CN1. The first switch SW00 is coupled to and disposed between the first spare row line RWL00 and the first access node CN0, and switches according to whether the first memory cell MC0 is a failure memory cell or not when the first memory cell MC0 is selected. The second switch SW01 is coupled to and disposed between the second spare row line RWL10 and the second access node CN1, and switches according to whether the second memory cell MC1 is a failure memory cell or not when the second memory cell MC1 is selected. The third switch SW02 is coupled to and disposed between the first spare row line RWL00 and a ground voltage end VSS, and switches according to whether the fuse F0 is programmed or not through a first program operation. The fourth switch SW03 is coupled to and disposed between the second spare row line RWL10 and the ground voltage end VSS, and switches according to whether the fuse F0 is programmed or not through a second program operation.

The fuse F0 may be designed to be in a high resistance state, that is, an off state, at an initial stage and be changed into an on state by generating a permanent electrical conductive path according to a voltage applied thereto. The fuse F0 may include any of an electrical fuse (e-fuse), an antifuse, etc. For example, the fuse F0 may include a MOS transistor having a gate coupled to a common node of the first normal row line WL00 and the second normal row line WL10, a first junction region coupled to the first access node CN0, and a second junction region coupled to the second access node CN1.

In this implementation, whether to program the fuse F0 through the first program operation or not may be determined by a voltage difference between the first access node CN0 and the first normal row line WL00. For example, the fuse F0 may be programmed through the first program operation by a dielectric breakdown, wherein the dielectric breakdown occurs between the gate and the first junction region when a third voltage, which is a high voltage, is applied to the first normal row line WL00 and a ground voltage VSS is applied to the first access node CN0. As the fuse F0 is programmed through the first program operation, the first normal row line WL00 and the first access node CN0 may be electrically connected to each other.

Figure 3:
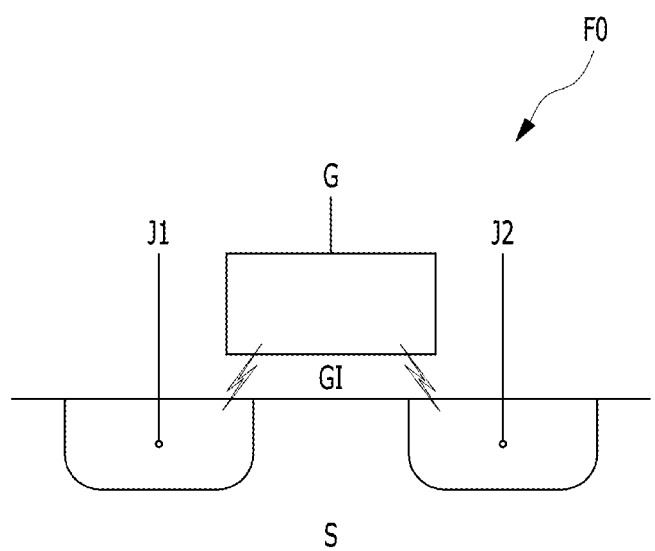
FIG. 3 is a cross-sectional view illustrating an example of a fuse of FIG. 2.

Also, whether to perform the second program operation on the fuse F0 or not may be determined by a voltage difference between the second normal row line WL10 and the second access node CN1. For example, the second program operation may be performed on the fuse F0 to cause a dielectric breakdown between the gate and the second junction region by applying the third voltage to the second normal row line WL10 and applying the ground voltage VSS to the second access node CN1. As the fuse F0 is programmed through the second program operation, the second normal row line WL10 and the second access node CN1 may be electrically connected to each other. A structure of the fuse F0 is shown in FIG. 3 and will be described later.

The first switch SW00 may selectively couple the first access node CN0 to the first spare row line RWL00 in response to a first row selection signal XSEL<00>. For example, if the first memory cell MC0 is selected and the first memory cell MC0 is a failure memory cell, the first switch SW00 may couple the first access node CN0 to the first spare row line RWL00. Conversely, if the first memory cell MC0 is selected and the first memory cell MC0 is not a failure memory cell, the first switch SW00 may not couple the first access node CN0 to the first spare row line RWL00. Also, while the first program operation is performed, the first switch SW00 may couple the first access node CN0 to the first spare row line RWL00. Meanwhile, although not illustrated in the drawings, the first row selection signal XSEL<00> may be an internal signal that is generated corresponding to the first row address X0_ADD. For example, the first row selection signal XSEL<00> may be enabled when the first memory cell MC0 is selected and the first memory cell MC0 is a failure memory cell. The first row selection signal XSEL<00> may be also enabled when the first program operation is performed in a test mode.

The second switch SW01 may selectively couple the second access node CN1 to the second spare row line RWL10 in response to a second row selection signal XSEL<01>. For example, if the second memory cell MC1 is selected and the second memory cell MC1 is a failure memory cell, the second switch SW01 may couple the second access node CN1 and the second spare row line RWL10 to each other. Conversely, if the second memory cell MC1 is selected and the second memory cell MC1 is not a failure memory cell, the second switch SW01 may not couple the second access node CN1 to the second spare row line RWL10. Also, the second switch SW01 may couple the second access node CN1 to the second spare row line RWL10 during the second program operation. Meanwhile, although it is not shown in the drawings, the second row selection signal XSEL<01> may be an internal signal generated corresponding to a second row address X1_ADD. For example, the second row selection signal XSEL<01> may be enabled when the second memory cell MC1 is selected and the second memory cell MC1 is a failure memory cell. The second row selection signal XSEL<01> may also be enabled when the second program operation is performed in the test mode.

The third switch SW02 may selectively couple the first spare row line RWL00 to the ground voltage end VSS in response to a first program enable signal EN_REPAIR<00>. For example, when the first program operation is performed on the fuse F0, the third switch SW02 may couple the first spare row line RWL00 to the ground voltage end VSS. Conversely, when the first program operation is not performed on the fuse F0, the third switch SW02 may not couple the first spare row line RWL00 to the ground voltage end VSS. Meanwhile, although it is not shown in the drawings, the first program enable signal EN_REPAIR<00> may be an external signal input from an external device or an internal signal generated inside the memory circuit 100 during a predetermined mode. For example, the first program enable signal EN_REPAIR<00> may be enabled when the fuse F0 is programmed through the first program operation in the test mode.

The fourth switch SW03 may selectively couple the second spare row line RWL10 to the ground voltage end VSS in response to a second program enable signal EN_REPAIR<10>. For example, when the second program operation is performed on the fuse F0, the fourth switch SW03 may couple the second spare row line RWL10 to the ground voltage end VSS. Conversely, when the second program operation is not performed on the fuse F0, the fourth switch SW03 may not couple the second spare row line RWL10 to the ground voltage end VSS. Meanwhile, although it is not shown in the drawings, the second program enable signal EN_REPAIR<10> may be an external signal input from an external device or an internal signal generated inside the memory circuit 100 during a predetermined mode. For example, the second program enable signal EN_REPAIR<10> may be enabled when the fuse F0 is programmed through the second program operation in the test mode.

Hereinafter, an operation of the memory circuit 100 having the above-described structure shown in FIG. 2 is sequentially described.

First, in a first stage of a test mode, the first memory cell MC0 and the second memory cell MC1 may be tested to determine if each of the first memory cell MC0 and the second memory cell MC1 is a failure memory cell or not. For example, the first memory cell MC0 and the second memory cell MC1 may be tested in the first stage of the test mode by writing predetermined data in the first memory cell MC0 and the second memory cell MC1 and then reading the predetermined data out of the first memory cell MC0 and the second memory cell MC1.

Subsequently, if it is determined in the first stage of the test mode that the first memory cell MC0 is a failure memory cell, the memory circuit 100 may perform a first program operation on the fuse F0 in a second stage of the test mode. For example, when the second stage of the test mode begins, the first row driving unit XDRV00 may drive the first normal row line WL00 with a third voltage, e.g., a high voltage, for the first program operation, and the first switch SW00 may couple the first access node CN0 to the first spare row line RWL00 in response to the first row selection signal XSEL<00>, and the third switch SW02 may couple the first spare row line RWL00 to the ground voltage end VSS in response to the first program enable signal EN_REPAIR<00>. As a result, since one end, i.e., the first access node CN0, of the fuse F0 falls in a row voltage level, e.g., the ground voltage VSS, and the third voltage is applied to a gate of the fuse F0, the fuse F0 is programmed by a high voltage difference between the one end and the gate so that the fuse F0 mediates an electrical connection between first normal row line WL00 and the first access node CN0.

Otherwise, if it is determined in the first stage of the test mode that the second memory cell MC1 is a failure memory cell, the memory circuit 100 may perform a second program operation on the fuse F0 during the second stage of the test mode. For example, when the second stage of the test mode begins, the second row driving unit XDRV10 may drive the second normal row line WL10 with the third voltage, and the second switch SW01 may couple the second access node CN1 to the second spare row line RWL10 in response to the second row selection signal XSEL<01>, and the fourth switch SW03 may couple the second spare row line RWL10 to the ground voltage end VSS in response to the second program enable signal EN_REPAIR<10>. As a result, since the other end, i.e., the second access node CN1, of the fuse F0 falls in a row voltage level, e.g., the ground voltage VSS, and the third voltage is applied to the gate of the fuse F0, the fuse F0 is programmed by a high voltage difference between the other end and the gate so that the fuse F0 mediates an electrical connection between the second normal row line WL10 and the second access node CN1.

Subsequently, when a normal mode begins and the first memory cell MC0 is selected, the memory circuit 100 may access the first memory cell MC0 or the first spare cell SC0 based on whether the first memory cell MC0 is a failure memory cell or not.

If the first memory cell MC0 is a failure memory cell, the first spare cell SC0 may be accessed instead of the first memory cell MC0. To be specific, when the first row driving unit XDRV00 drives the first normal row line WL00 with the first voltage, the first switch SW00 may electrically couple the first access node CN0 to the first spare row line RWL00 in response to the first row selection signal XSEL<00>. In this implementation, the first row selection signal XSEL<00> may be enabled when the first row driving unit XDRV00 is enabled and the first memory cell MC0 is a failure memory cell. As a result, the first voltage may be transmitted to the first spare row line RWL00 through the first normal row line WL00 and the first common row coupling unit FS0. When the first column driving unit YDRV00 drives the first spare column line RCL00 with the second voltage, the first column coupling unit RS00 may electrically disconnect the first spare column line RCL00 from the first normal column line CL00 in response to the first column selection signal YSEL<00>. In this implementation, the first column selection signal YSEL<00> may be disabled when the first column driving unit YDRV00 is enabled and the first memory cell MC0 is a failure memory cell. As a result, the second voltage may be applied only to the first spare column line RCL00, and the first column coupling unit RS00 may prevent the second voltage from being transmitted to the first normal column line CL00. Therefore, when the first memory cell MC0 is selected and the first memory cell MC0 is a failure memory cell, the first spare cell SC0, disposed at the cross point of the first spare row line RWL00 to which the first voltage is applied and the first spare column line RCL00 to which the second voltage is applied, may be accessed instead of the first memory cell MC0.

If the first memory cell MC0 is not a failure memory cell, the first memory cell MC0 may be accessed. To be specific, when the first row driving unit XDRV00 drives the first normal row line WL00 with the first voltage, the first switch SW00 may electrically disconnect the first access node CN0 from the first spare row line RWL00 in response to the first row selection signal XSEL<00>. In this implementation, the first row selection signal XSEL<00> may be disabled when the first row driving unit XDRV00 is enabled and the first memory cell MC0 is a normal memory cell. As a result, the first voltage may be applied only to the first normal row line WL00, and the first row coupling unit FS0 may prevent the first voltage from being transmitted to the first spare row line RWL00. Also, when the first column driving unit YDRV00 drives the first spare column line RCL00 with the second voltage, the first column coupling unit RS00 may electrically connect the first spare column line RCL00 to the first normal column line CL00 in response to the first column selection signal YSEL<00>. In this implementation, the first column selection signal YSEL<00> may be enabled when the first column driving unit YDRV00 is enabled and the first memory cell MC0 is a normal memory cell. Therefore, when the first memory cell MC0 is selected and the first memory cell MC0 is not a failure memory cell, the first memory cell MC0 disposed at the cross point of the first normal row line WL00 to which the first voltage is applied and the first normal column line CL00 to which the second voltage is applied may be accessed.

Meanwhile, when the normal mode begins and the second memory cell MC1 is selected, the memory circuit 100 may access the second memory cell MC1 or the second spare cell SC1 based on whether the second memory cell MC1 is a failure memory cell or not.

If the second memory cell MC1 is a failure memory cell, the second spare cell SC1 may be accessed instead of the second memory cell MC1. To be specific, when the second row driving unit XDRV10 drives the second normal row line WL10 with the first voltage, the second switch SW01 may electrically couple the second access node CN1 to the second spare row line RWL10 in response to the second row selection signal XSEL<01>. In this implementation, the second row selection signal XSEL<01> may be enabled when the second row driving unit XDRV10 is enabled and the second memory cell MC1 is a failure memory cell. As a result, the first voltage may be transmitted to the second spare row line RWL10 through the second normal row line WL10 and the first common row coupling unit FS0. When the second column driving unit YDRV10 drives the second spare column line RCL10 with the second voltage, the second column coupling unit RS10 may electrically disconnect the second spare column line RCL10 from the second normal column line CL10 in response to the second column selection signal YSEL<10>. In this implementation, the second column selection signal YSEL<10> may be disabled when the first column driving unit YDRV10 is enabled and the second memory cell MC1 is a failure memory cell. As a result, the second voltage may be applied only to the second spare column line RCL10, and the second column coupling unit RS10 may prevent the second voltage from being transmitted to the second normal column line CL10. Therefore, when the second memory cell MC1 is selected and the second memory cell MC1 is a failure cell, the second spare cell SC1, disposed at the cross point of the second spare row line RWL10 to which the first voltage is applied and the second spare column line RCL10 to which the second voltage is applied, may be accessed instead of the second memory cell MC1.

If the second memory cell MC1 is not a failure memory cell, i.e., the second memory cell MC1 is a normal memory cell, the second memory cell MC1 may be accessed. Specifically, when the second row driving unit XDRV10 drives the second normal row line WL10 with the first voltage, the second switch SW01 may electrically disconnect the second access node CN1 from the second spare row line RWL10 in response to the second row selection signal XSEL<01>. In this implementation, the second row selection signal XSEL<01> may be disabled when the second row driving unit XDRV10 is enabled and the second memory cell MC1 is a normal memory cell. As a result, the first voltage may be applied only to the second normal row line WL10, and the first common row coupling unit FS0 may prevent the first voltage from being transmitted to the second spare row line RWL10. Also, when the second column driving unit YDRV10 drives the second spare column line RCL10 with the second voltage, the second column coupling unit RS10 may electrically connect the second spare column line RCL10 to the second normal column line CL10 in response to the second column selection signal YSEL<10>. In this implementation, the second column selection signal YSEL<10> may be enabled when the second column driving unit YDRV10 is enabled and the second memory cell MC1 is a normal memory cell. Therefore, when the second memory cell MC1 is selected and the second memory cell MC1 is not a failure cell, the second memory cell MC1 disposed at the cross point of the second normal row line WL10 to which the first voltage is applied and the second normal column line CL10 to which the second voltage is applied may be accessed.

FIG. 3 is a cross-sectional view illustrating an example of the fuse of FIG. 2.

Referring to FIG. 3, the fuse F0 may include a gate electrode G formed over a semiconductor substrate S, a gate dielectric layer GI interposed between the gate electrode G and the semiconductor substrate S, and first and second junction regions J1 and J2 which are formed in the semiconductor substrate S at both sides of the gate electrode G. The gate electrode G may include a single-layered structure or a multi-layered structure including various conductive materials. The gate dielectric layer GI may include a single-layered structure or a multi-layered structure including various dielectric materials such as a silicon oxide. The first and second junction regions J1 and J2 may include impurities doped into the semiconductor substrate S by various methods such as an ion implantation process.

When a high voltage such as a program voltage is applied to the gate electrode G and a low voltage such as a ground voltage is applied to the first junction region J1, a portion of the gate dielectric layer GI, which corresponds to a region between the gate electrode G and the first junction region J1, may be destroyed by a voltage difference between the gate electrode G and the first junction region J1 (represented by a left zig-zag shape in FIG. 3). Meanwhile, when the high voltage such as the program voltage is applied to the gate electrode G and the low voltage such as the ground voltage is applied to the second junction region J2, a portion of the gate dielectric layer GI, which corresponds to a region between the gate electrode G and the second junction region J2, may be destroyed by a voltage difference between the gate electrode G and the second junction region J2 (represented by a right zig-zag shape in FIG. 3). A process of causing a first dielectric breakdown in the region between the gate electrode G and the first junction region J1 and a process of causing a second dielectric breakdown in the region between the gate electrode G and the second junction region J2 may be independently performed. That is, the first dielectric breakdown and the second dielectric breakdown may be performed at the same time, or with a time lag therebetween. When the first dielectric breakdown and the second dielectric breakdown are performed with the time lag, one of the first and second junction regions J1 and J2 may be in a floating state. For example, when only the first dielectric breakdown is performed, the second junction region J2 may be in a floating state. Conversely, when only the second dielectric breakdown is performed, the first junction region J1 may be in a floating state.

In FIG. 3, the fuse F0 includes one gate and two junction regions. However, in other implementations, the fuse F0 may have one gate and three or more junction regions, and a dielectric breakdown between the gate and each of the junction regions may be performed independently. As a result, it is possible to drive three or more memory areas and three or more spare areas which correspond to the memory areas, respectively, using one fuse F0. This will be exemplarily described with reference to FIGS. 4 and 5.

Figure 4:
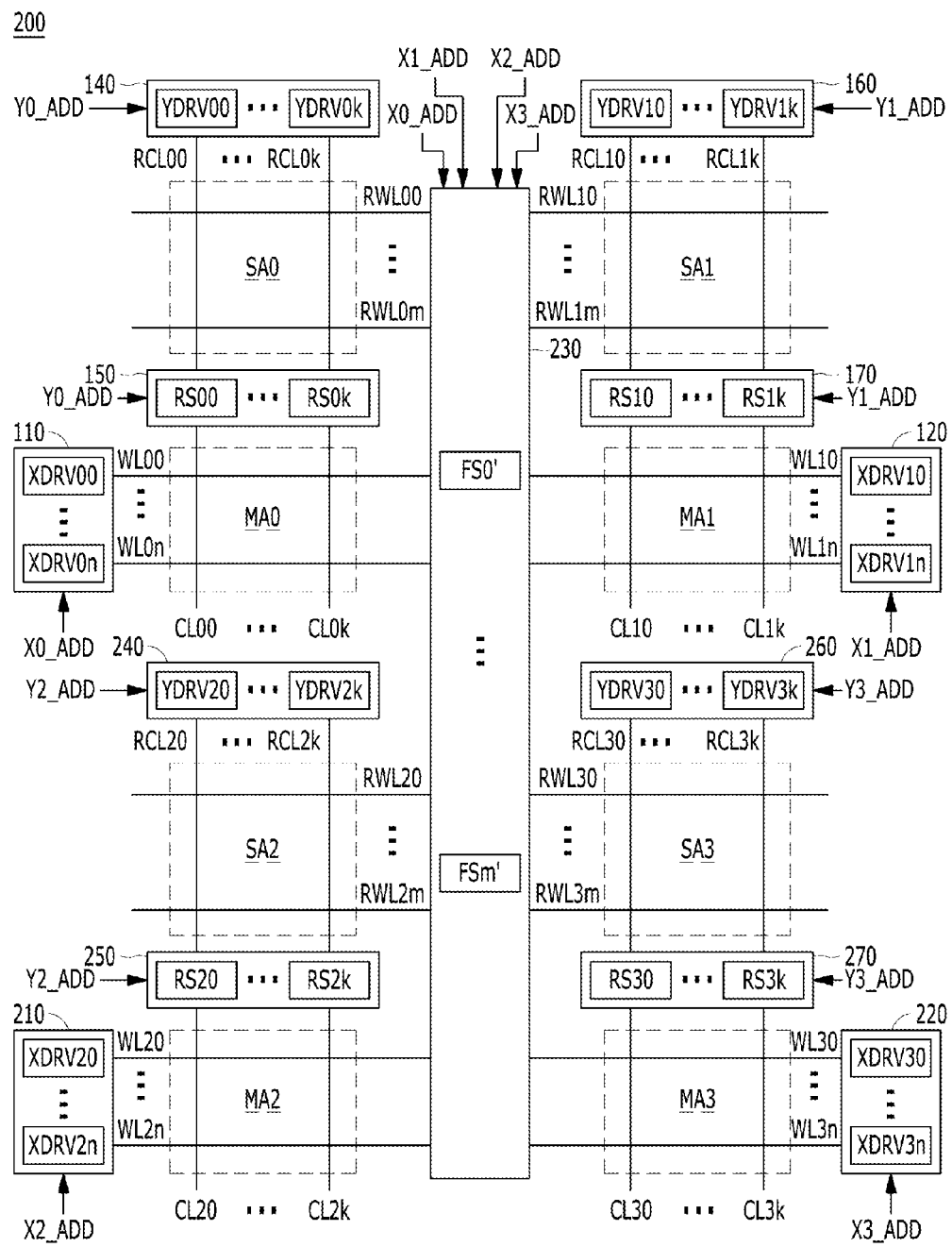
FIG. 4 is a view illustrating a memory circuit in accordance with another implementation.

FIG. 4 is a view illustrating a memory circuit 200 in accordance with another implementation. The memory circuit 200 includes four memory areas and four spare areas which correspond to the four memory areas, respectively. Hereinafter, differences from FIG. 1 will be mainly described.

Referring to FIG. 4, the memory circuit 200 may include a third memory area MA2, a third spare area SA2, a third row driving block 210, a fourth memory area MA3, a fourth spare area SA3, a fourth row driving block 220, a third column driving block 240, a third column coupling block 250, a fourth column driving block 260, and a fourth column coupling block 270, in addition to the configuration shown in FIG. 1 that includes the first memory area MA0, the first spare area SA0, the first row driving block 110, the second memory area MA1, the second spare area SA1, the second row driving block 120, the first column driving block 140, the first column coupling block 150, the second column driving block 160, and the second column coupling block 170. In this implementation shown in FIG. 4, the row coupling block 130 of FIG. 1 may be replaced by a row coupling block 230.

The additional components of FIG. 4 may be substantially the same as the components of FIG. 1. That is, in the memory circuit 200, the third memory area MA2 may include memory cells of a third group that are located at cross points where normal row lines WL20 to WL2n of the third group intersect with normal column lines CL20 to CL2k of the third group. The third spare area SA2 may include spare cells of the third group that are located at cross points where spare row lines RWL20 to RWL2m of the third group intersect with spare column lines RCL20 to RCL2k of the third group. The third row driving block 210 may selectively enable the normal row lines WL20 to WL2n of the third group based on a third row address X2_ADD.

The fourth memory area MA3 may include memory cells of a fourth group that are located at cross points where normal row lines WL30 to WL3n of the fourth group intersect with normal column lines CL30 to CL3k of the fourth group. The fourth spare area SA3 may include spare cells of the fourth group that are located at cross points where spare row lines RWL30 to RWL3m of the fourth group intersect with spare column lines RCL30 to RCL3k of the fourth group. The fourth row driving block 220 may selectively enable the normal row lines WL30 to WL3n of the fourth group based on a fourth row address X3_ADD.

The third column driving block 240 may selectively enable the spare column lines RCL20 to RCL2k of the third group based on a third column address Y2_ADD. The third column coupling block 250 may selectively couple the spare column lines RCL20 to RCL2k of the third group with the normal column lines CL20 to CL2k of the third group based on the third column address Y2_ADD.

The fourth column driving block 260 may selectively enable the spare column lines RCL30 to RCL3k of the fourth group based on a fourth column address Y3_ADD. The fourth column coupling block 270 may selectively couple the spare column lines RCL30 to RCL3k of the fourth group with the normal column lines CL30 to CL3k of the fourth group based on the fourth column address Y3_ADD.

The row coupling block 230 may selectively couple the normal row lines WL00 to WL0n of the first group with the spare row lines RWL00 to RWL0m of the first group based on the first row address X0_ADD, selectively couple the normal row lines WL10 to WL1n of the second group with the spare row lines RWL10 to RWL1m of the second group based on the second row address X1_ADD, selectively couple the normal row lines WL20 to WL2n of the third group with the spare row lines RWL20 to RWL2m of the third group based on the third row address X2_ADD, and selectively couple the normal row lines WL30 to WL3n of the fourth group with the spare row lines RWL30 to RWL3m of the fourth group based on the fourth row address X3_ADD. The row coupling block 230 may include a plurality of common row coupling units FS0' to FSm' for selectively coupling the normal row lines WL00 to WL0n of the first group with the spare row lines RWL00 to RWL0m of the first group, for selectively coupling the normal row lines WL10 to WL1n of the second group with the spare row lines RWL10 to RWL1m of the second group, for selectively coupling the normal row lines WL20 to WL2n of the third group with the spare row lines RWL20 to RWL2m of the third group, and for selectively coupling the normal row lines WL30 to WL3n of the fourth group with the spare row lines RWL30 to RWL3m of the fourth group.

Figure 5:
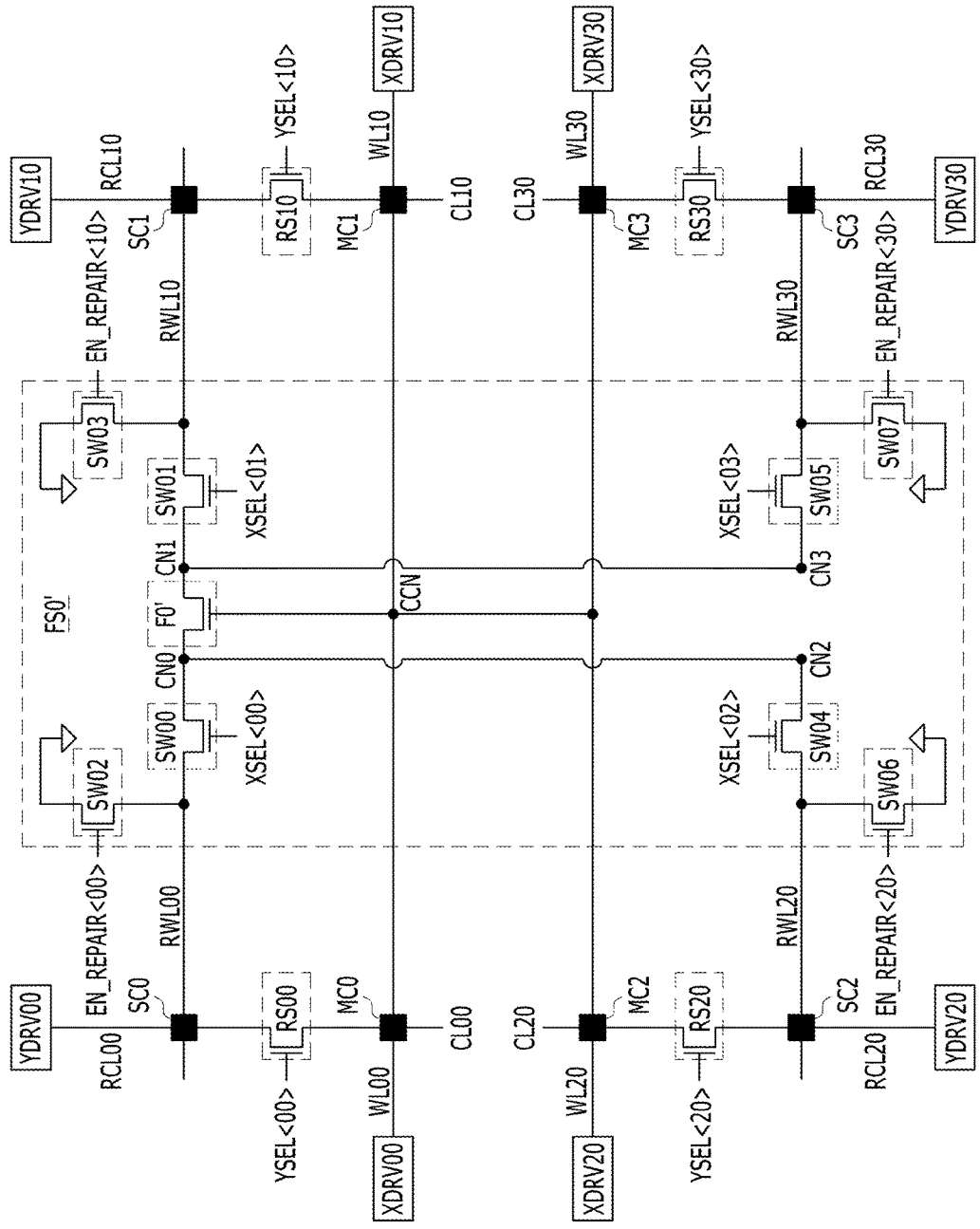
FIG. 5 is a view illustrating a portion of the memory circuit shown in FIG. 4 in accordance with an implementation.

FIG. 5 is a view illustrating a portion of the memory circuit 200 shown in FIG. 4 in detail. For the sake of convenience of description, only parts of components shown in FIG. 4 are shown in FIG. 5. Hereinafter, differences from FIG. 2 will be mainly described.

Referring to FIG. 5, the memory circuit 200 may include a third normal row line WL20, a third normal column line CL20, a third memory cell MC2, a third spare row line RWL20, a third spare column line RCL20, a third spare cell SC2, a third row driving unit XDRV20, a fourth normal row line WL30, a fourth normal column line CL30, a fourth memory cell MC3, a fourth spare row line RWL30, a fourth spare column line RCL30, a fourth spare cell SC3, a fourth row driving unit XDRV30, a third column driving unit YDRV20, a third column coupling unit RS20, a fourth column driving unit YDRV30, and a fourth column coupling unit RS30; in addition to the configuration shown in FIG. 2 that includes the first normal row line WL00, the first normal column line CL00, the first memory cell MC0, the first spare row line RWL00, the first spare column line RCL00, the first spare cell SC0, the first row driving unit XDRV00, the second normal row line WL10, the second normal column line CL10, the second memory cell MC1, the second spare row line RWL10, the second spare column line RCL10, the second spare cell SC1, the second row driving unit XDRV10, the first column driving unit YDRV00, the first column coupling unit RS00, the second column driving unit YDRV10, and the second column coupling unit RS10. In this implementation shown in FIG. 5, the first common row coupling unit FS0 of FIG. 2 may be replaced by a first common row coupling unit FS0'.

The additional components of FIG. 5 and an operating method thereof may be substantially the same as or similar to the components of FIG. 2 and the operating method thereof. Therefore, detailed descriptions thereof may be omitted. Hereinafter, the first common row coupling unit FS0' of FIG. 5 may be described in more detail.

The first common row coupling unit FS0' may include a fifth switch SW04, a sixth switch SW05, a seventh switch SW06, and a eighth switch SW07 in addition to the first switch SW00, the second switch SW01, the third switch SW02, and the fourth switch SW03 of FIG. 2. The fuse F0 of FIG. 2 may be replaced by a fuse F0' of FIG. 5

Figure 6A:
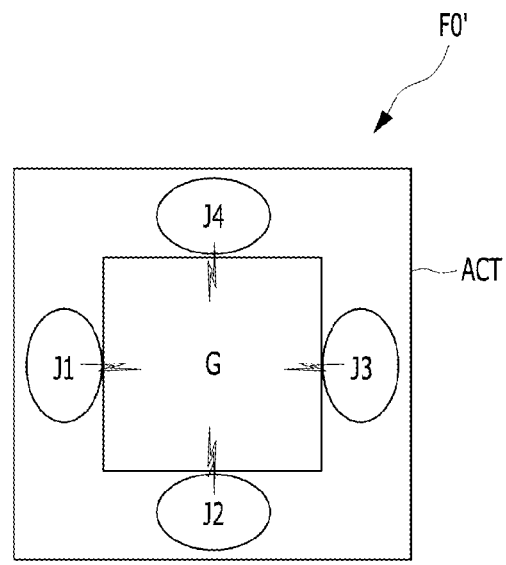
FIG. 6A is a plan view illustrating an example of a fuse of FIG. 5.
Figure 6B:
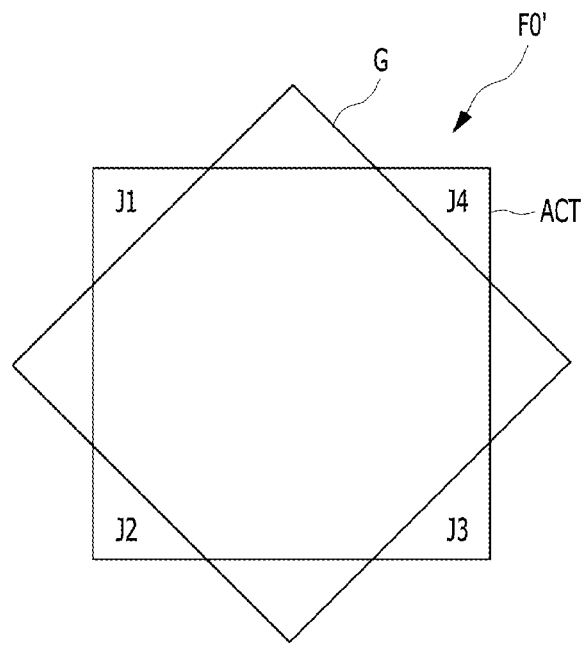
FIG. 6B is a plan view illustrating another example of the fuse of FIG. 5.

The fuse F0' may include one gate and first to fourth junction regions. The gate of the fuse F0' may be coupled to a common node CCN of the first to fourth normal row lines WL00, WL10, WL20 and WL30. The first junction region of the fuse F0' may be coupled to the first access node CN0, the second junction region of the fuse F0' may be coupled to the second access node CN1, the third junction region of the fuse F0' may be coupled to the third access node CN2, and the fourth junction region of the fuse F0' may be coupled to the fourth access node CN3. In this implementation, whether to perform a first program operation or not may be decided based on a voltage difference between the first access node CN0 and the first normal row line WL00, whether to perform a second program operation or not may be decided based on a voltage difference between the second access node CN1 and the second normal row line WL10, whether to perform a third program operation or not may be decided based on a voltage difference between the third access node CN2 and the third normal row line WL20, and whether to perform a fourth program operation or not may be decided based on a voltage difference between the fourth access node CN3 and the fourth normal row line WL30. The first to fourth program operations may be performed independently from each other in a second stage of a test mode. Examples of a structure of the fuse F0' are shown in FIGS. 6A and 6B and will be described later.

The fifth switch SW04 may selectively couple the third access node CN2 to the third spare row line RWL20 in response to a third row selection signal XSEL<02>. For example, if the third memory cell MC2 is selected and the third memory cell MC2 is a failure memory cell, the fifth switch SW04 may couple the third access node CN2 to the third spare row line RWL20. Conversely, if the third memory cell MC2 is selected and the third memory cell MC2 is not a failure memory cell, the fifth switch SW04 may block a connection between the third access node CN2 and the third spare row line RWL20. Also, when the third program operation is performed, the fifth switch SW04 may couple the third access node CN2 to the third spare row line RWL20.

The sixth switch SW05 may selectively couple the fourth access node CN3 to the fourth spare row line RWL30 in response to a fourth row selection signal XSEL<03>. For example, if the fourth memory cell MC3 is selected and the fourth memory cell MC3 is a failure memory cell, the sixth switch SW05 may couple the fourth access node CN3 to the fourth spare row line RWL30. Conversely, if the fourth memory cell MC3 is selected and the fourth memory cell MC3 is not a failure memory cell, the sixth switch SW05 may block a connection between the fourth access node CN3 and the fourth spare row line RWL30. Also, when the fourth program operation is performed, the sixth switch SW05 may couple the fourth access node CN3 to the fourth spare row line RWL30.

The seventh switch SW06 may selectively couple the ground voltage end VSS to the third spare row line RWL20 in response to a third program enable signal EN_REPAIR<20>. For example, when the third program operation is performed, the seventh switch SW06 may couple the ground voltage end VSS to the third spare row line RWL20. In other cases, the seventh switch SW06 may block a connection between the ground voltage end VSS and the third spare row line RWL20.

The eighth switch SW07 may selectively couple the ground voltage end VSS to the fourth spare row line RWL30 in response to a fourth program enable signal EN_REPAIR<30>. For example, when the fourth program operation is performed, the eighth switch SW07 may couple the ground voltage end VSS to the fourth spare row line RWL30. In other cases, the eighth switch SW07 may block a connection between the ground voltage end VSS and the fourth spare row line RWL30.

When the fuse F0' has four junction regions as shown in FIG. 5, the fuse F0' can control a connection between the first memory cell MC0 and the first spare cell SC0, a connection between the second memory cell MC1 and the second spare cell SC1, a connection between the third memory cell MC2 and the third spare cell SC2, and a connection between the fourth memory cell MC3 and the fourth spare cell SC3. Examples of a structure in which the fuse F0' has the four junction regions are described in more detail with reference to FIGS. 6A and 6B.

FIG. 6A is a plan view illustrating an example of the fuse F0' of FIG. 5.

Referring to FIG. 6A, the fuse F0' may include a semiconductor substrate in which an active region ACT is defined, a gate electrode G formed over the active region ACT with a gate dielectric layer (not shown) interposed therebetween and having four sides, and first to fourth junction regions J1, J2, J3 and J4 formed in the active region ACT at four sides of the gate electrode G, respectively. The first to fourth junction regions J1, J2, J3 and J4 may be formed by forming a mask pattern, which exposes corresponding regions in the active region ACT, and doping impurities into the exposed regions.

Herein, when a high voltage is applied to the gate electrode G and a low voltage is applied to the first junction region J1, a first dielectric breakdown may occur in a first portion of the gate dielectric layer between the gate electrode G and the first junction region J1 (see a left zig-zag shape with respect to the orientation of FIG. 6A). Similarly, a second dielectric breakdown may occur in a second portion of the gate dielectric layer between the gate electrode G and the second junction region J2 (see a lower zig-zag shape with respect to the orientation of FIG. 6A) when the high voltage is applied to the gate electrode G and the low voltage is applied to the second junction region J2. Similarly, a third dielectric breakdown may occur in a third portion of the gate dielectric layer between the gate electrode G and the third junction region J3 (see a right zig-zag shape with respect to the orientation of FIG. 6A) when the high voltage is applied to the gate electrode G and the low voltage is applied to the third junction region J3. Similarly, a fourth dielectric breakdown may occur in a first portion of the gate dielectric layer between the gate electrode G and the fourth junction region J4 (see an upper zig-zag shape with respect to the orientation of FIG. 6A) when the high voltage is applied to the gate electrode G and the low voltage is applied to the fourth junction region J4. Processes of causing the first to fourth dielectric breakdowns may be independently performed.

FIG. 6B is a plan view illustrating another example of the fuse F0' of FIG. 5.

Referring to FIG. 6B, after an active region ACT having a rectangular shape is formed, a gate electrode G having a rectangular shape may be formed to overlap the active region ACT so that the gate electrode G may have four edge portions laterally protruding from the active region ACT in a plan view. As a result, four edge portions of the active region ACT are exposed by the gate electrode G. First to fourth junction regions J1, J2, J3 and J4 may be formed in the four edge portions of the active region ACT that are exposed by the gate electrode G, respectively. The first to fourth junction regions J1, J2, J3 and J4 may be formed by doping impurities into the active region ACT exposed by the gate electrode G without using a mask pattern. The active region ACT may be defined by an isolation region which is formed of an insulating material.

By the implementation of FIG. 6B, the number of processes may be reduced because at least a process of forming a mask pattern used to form the junction regions J1, J2, J3 and J4 can be omitted, and it is easy to separate the junction regions J1, J2, J3 and J4 from each other.

In the above description of FIGS. 4 to 6B, the fuse F0' has the four junction regions. However, the fuse F0' may have three junction regions, or, five or more junction regions, as necessary. For example, the number of junction regions of the fuse F0' may be changed according to the number of memory areas and spare areas. This may be generalized as shown in FIG. 7.

Figure 7:
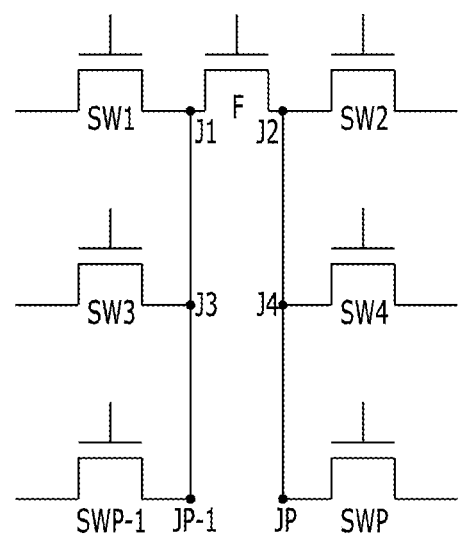
FIG. 7 is a view illustrating a fuse and a plurality of switches coupled to the fuse in accordance with an implementation.

FIG. 7 is a view illustrating a fuse and a plurality of switches coupled to the fuse in accordance with an implementation.

Referring to FIG. 7, the fuse F of the implementation may include one gate and P numbers of junction regions J1, J2, J3, J4, ..., JP-1 and JP, P being a positive integer. First ends of P numbers of switches SW1, SW2, SW3, SW4, ..., SWP-1 and SWP may be coupled to the P numbers of junction regions J1, J2, J3, J4, ..., JP-1 and JP, respectively. The P numbers of switches SW1, SW2, SW3, SW4, ..., SWP-1 and SWP may correspond to the first switch SW00, the second switch SW01, the fifth switch SW04, and the sixth switch SW05 shown in FIG. 5. Although not shown, second ends of the P numbers of switches SW1, SW2, SW3, SW4, ..., SWP-1 and SWP may be coupled to other P numbers of switches, respectively. First ends of the other P numbers of switches may be coupled to the P numbers of switches SW1, SW2, SW3, SW4, ..., SWP-1 and SWP, respectively, and second ends of the other P numbers of switches may be coupled to a low voltage end, for example, a ground voltage end VSS. That is, the other P numbers of switches may correspond to the third switch SW02, the fourth switch SW03, the seventh switch SW06, and the eighth switch SW07 shown in FIG. 5.

When the fuse F has the P numbers of junction regions J1, J2, J3, J4, ..., JP-1 and JP which are separate from one another, a process of causing a dielectric breakdown between the fuse F and each of the P numbers of junction regions J1, J2, J3, J4, ..., JP-1 and JP may be independently performed. Therefore, a conductive path between the fuse F and each of the P numbers of switches SW1, SW2, SW3, SW4, ..., SWP-1 and SWP may be independently formed.

The fuse F, the P numbers of switches SW1, SW2, SW3, SW4, ..., SWP-1 and SWP, and the other P numbers of switches (not shown) may constitute one common row coupling unit to control connections between P numbers of memory areas and P numbers of spare areas. Since the common row coupling unit uses one fuse F, an area occupied by the common row coupling unit may be reduced. As a result, an area of a semiconductor memory may be reduced.

Examples of a structure in which one fuse F has a plurality of junction regions will be described in more detail with reference to FIGS. 8A to 10.

Figure 8A:
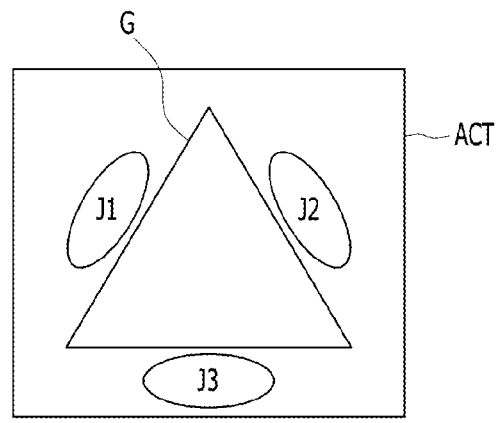
FIGS. 8A to 8C are plan views illustrating examples of the fuse of FIG. 7.
Figure 8B:
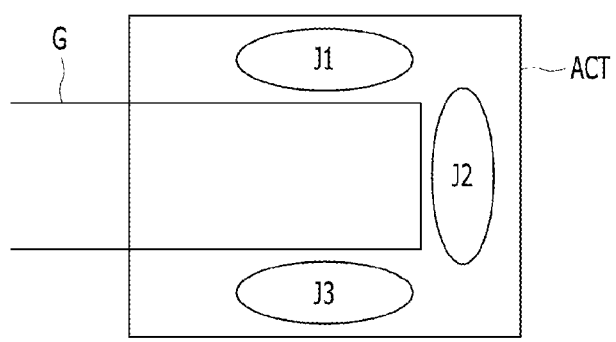
Figure 8C:
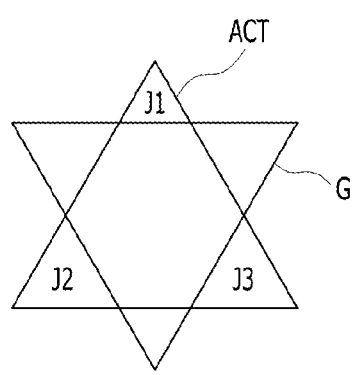

FIGS. 8A to 8C are plan views illustrating examples of a fuse F. Specially, FIGS. 8A to 8C each show a fuse F having three junction regions.

Referring to FIG. 8A, the fuse F may include a semiconductor substrate in which an active region ACT having a rectangular shape is defined, a gate electrode G formed over the active region ACT with a gate dielectric layer (not shown) interposed therebetween and having a triangular shape, and first to third junction regions J1, J2 and J3 formed in the active region ACT at three sides of the gate electrode G, respectively.

Referring to FIG. 8B, a gate electrode G may have a line shape and may extend out of one side of an active region ACT. In this implementation, the gate electrode G may have three sides over the active region ACT, and first to third junction regions J1, J2 and J3 may be formed in the active region ACT at the three sides of the gate electrode G, respectively.

Referring to FIG. 8C, an active region ACT and a gate electrode G may each have a triangular shape and may overlap so that the gate electrode G has three edge regions laterally protruding from the active region ACT in a plan view and thus the active region ACT has three edge regions that are exposed by the gate electrode G and laterally protrude from the gate electrode G. As a result, first to third junction regions J1, J2 and J3 may be formed in the three edge regions of the active region ACT.

Figure 9A:
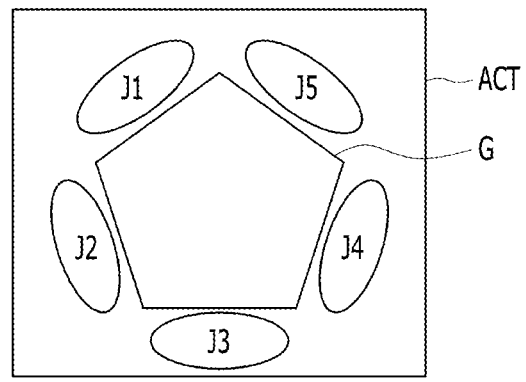
FIGS. 9A and 9B are plan views illustrating other examples of the fuse of FIG. 7.
Figure 9B:
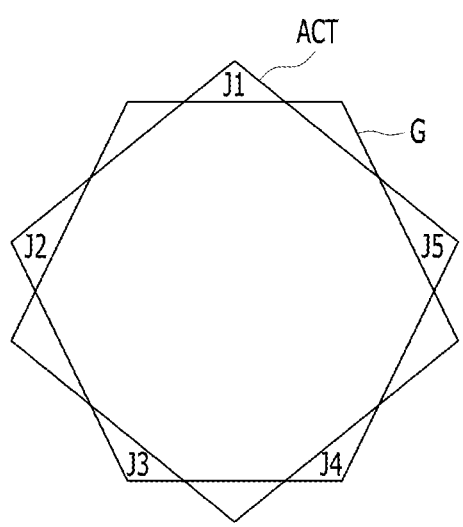

FIGS. 9A and 9B are plan views illustrating other examples of a fuse F. Specially, FIGS. 9A and 9B show the fuse F having five junction regions.

Referring to FIG. 9A, the fuse F may include a semiconductor substrate in which an active region ACT is defined, a gate electrode G formed over the active region ACT with a gate dielectric layer (not shown) interposed therebetween and having a pentagonal shape, and first to fifth junction regions J1, J2, J3, J4 and J5 formed in the active region ACT at five sides of the gate electrode G, respectively.

Referring to FIG. 9B, an active region ACT and a gate electrode G may each have a pentagonal shape and overlap so that the gate electrode G has five edge regions laterally protruding from the active region ACT in a plan view and the active region ACT also has five edge regions which are exposed by the gate electrode G and laterally protrude from the gate electrode G. As a result, first to fifth junction regions J1, J2, J3, J4 and J5 may be formed in the five edge regions of the active region ACT.

Meanwhile, FIGS. 8A to 9B each show gate electrodes that have convex polygonal shapes in plan views. However, in other implementations, a gate electrode having a concave polygonal shape may be provided. This will be exemplarily shown in FIG. 10.

Figure 10:
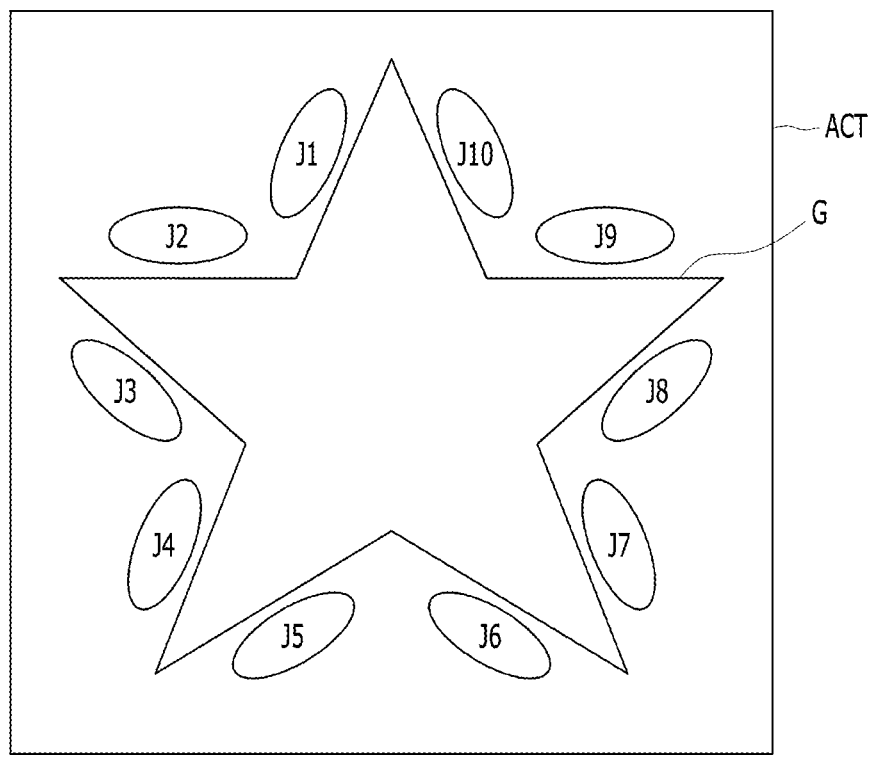
FIG. 10 is a plan view illustrating another example of the fuse of FIG. 7.

FIG. 10 is a plan view illustrating another example of a fuse F. Specially, FIG. 10 shows the fuse F having ten junction regions Referring to FIG. 10, the fuse F may include a semiconductor substrate in which an active region ACT having a rectangular shape is defined, a gate electrode G formed over the active region ACT with a gate dielectric layer (not shown) interposed therebetween and having a concave decagonal shape, and first to tenth junction regions J1, J2, J3, J4, J5, J6, J7, J8, J9 and 10 formed in the active region ACT at ten sides of the gate electrode G, respectively.

As generalizing a shape of a gate electrode and arrangement of junction regions in a fuse, the gate electrode may have a polygonal shape and N numbers of sides in a plan view. Although the gate electrode is formed to include a plurality of edge regions laterally protruding out of the active region and to be over the active region or the gate electrode is formed over the active region so that the whole gate electrode overlaps with the active region, the gate electrode is formed to have the N numbers of sides, and the N numbers of junction regions are formed in the active region at the N numbers of sides of the gate electrode. Also, the polygon may be a concave polygon or a convex polygon. The N numbers of junction regions which correspond to the N numbers of sides of the gate electrode, respectively, may be formed in portions of the active region exposed by the gate electrode. A dielectric breakdown may be independently performed between the gate electrode and each of the N numbers of junction regions.

The above and other memory circuits or semiconductor devices based on the disclosed technology can be used in a range of devices or systems. FIGS. 11-15 provide some examples of devices or systems that can implement the memory circuits disclosed herein.

Figure 11:
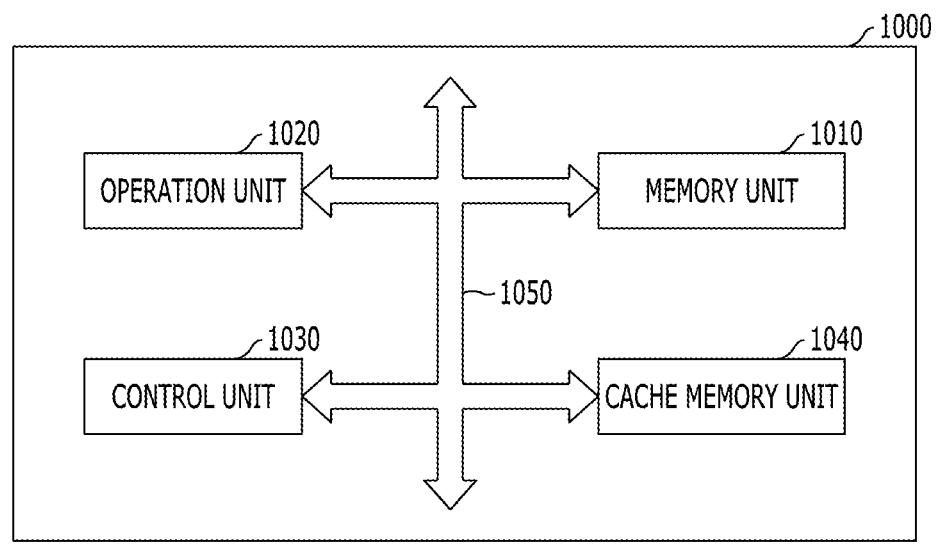
FIG. 11 is an example of configuration diagram of a microprocessor implementing memory circuitry based on the disclosed technology.

FIG. 11 is an example of configuration diagram of a microprocessor implementing memory circuitry based on the disclosed technology.

Referring to FIG. 11, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include first to Nth coupling lines coupled to first ends of first to Nth memory cells, respectively, where N is a natural number of 3 or more; first to Nth spare lines coupled to first ends of first to Nth spare cells, respectively, wherein the first to Nth spare cells correspond to the first to Nth memory cells, respectively; a driving block for selectively driving the first to Nth coupling lines with a predetermined voltage; and a repair coupling block for selectively coupling the first to Nth coupling lines with the first to Nth spare lines according to whether any of the first to Nth memory cells is a failure memory cell or not, wherein the repair coupling block includes a fuse, the fuse including a gate commonly coupled to the first to Nth coupling lines, first to Nth junction regions coupled to the first to Nth spare lines, respectively, and a dielectric layer interposed between the gate and the first to Nth junction regions, and wherein a dielectric breakdown between the gate and each of the first to Nth junction regions is independently performed. Through this, an area of the memory unit 1010 may be reduced and a degree of integration of the memory unit 1010 may be improved. As a consequence, an area of the microprocessor 1000 may be reduced and a degree of integration of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs. The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 12:
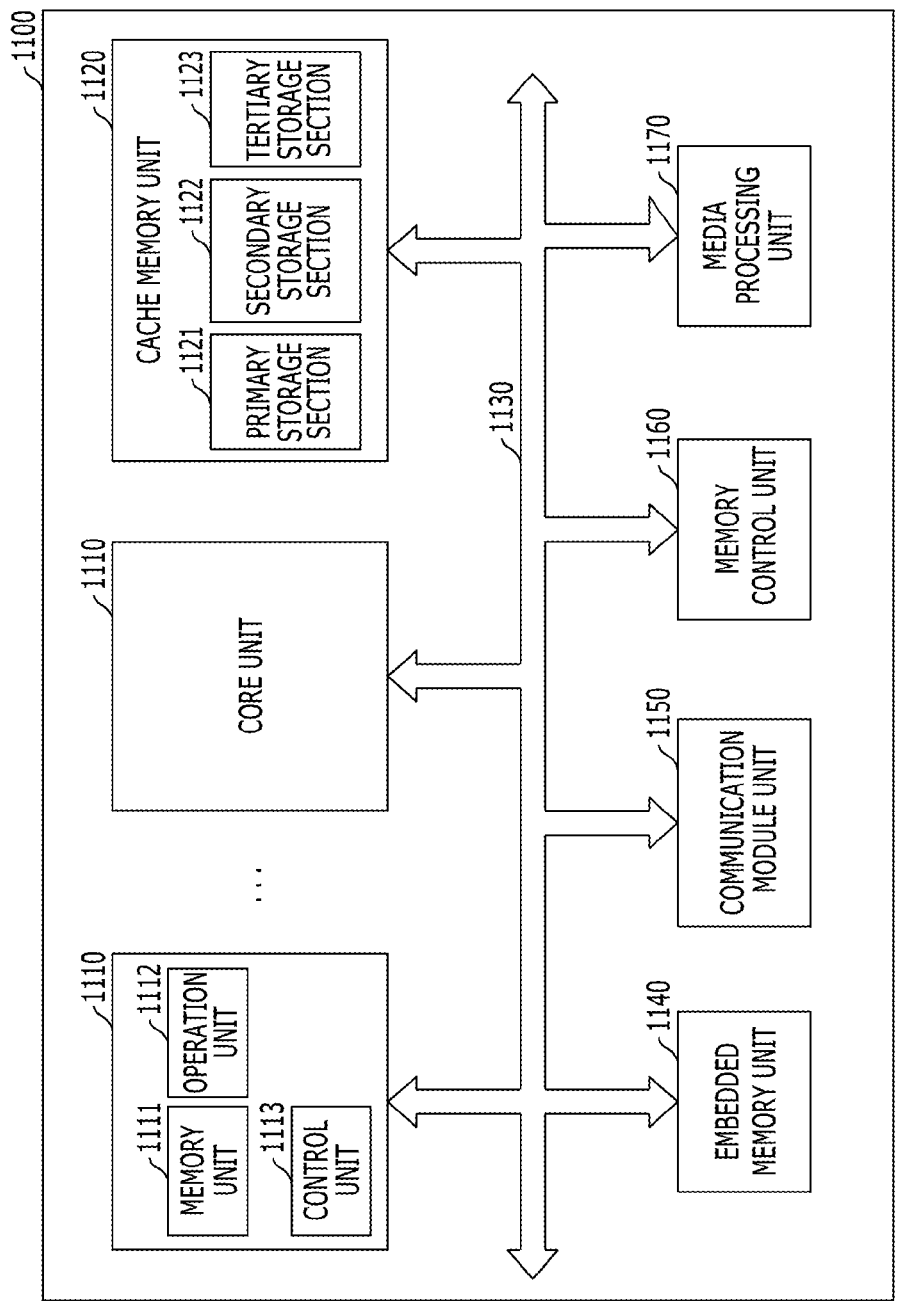
FIG. 12 is an example of configuration diagram of a processor implementing memory circuitry based on the disclosed technology.

FIG. 12 is an example of configuration diagram of a processor implementing memory circuitry based on the disclosed technology.

Referring to FIG. 12, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include first to Nth coupling lines coupled to first ends of first to Nth memory cells, respectively, where N is a natural number of 3 or more; first to Nth spare lines coupled to first ends of first to Nth spare cells, respectively, wherein the first to Nth spare cells correspond to the first to Nth memory cells, respectively; a driving block for selectively driving the first to Nth coupling lines with a predetermined voltage; and a repair coupling block for selectively coupling the first to Nth coupling lines with the first to Nth spare lines according to whether any of the first to Nth memory cells is a failure memory cell or not, wherein the repair coupling block includes a fuse, the fuse including a gate commonly coupled to the first to Nth coupling lines, first to Nth junction regions coupled to the first to Nth spare lines, respectively, and a dielectric layer interposed between the gate and the first to Nth junction regions, and wherein a dielectric breakdown between the gate and each of the first to Nth junction regions is independently performed. Through this, an area of the cache memory unit 1120 may be reduced and a degree of integration of the cache memory unit 1120 may be improved. As a consequence, an area of the processor 1100 may be reduced and a degree of integration of the processor 110 may be improved.

Although it was shown in FIG. 12 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 13:
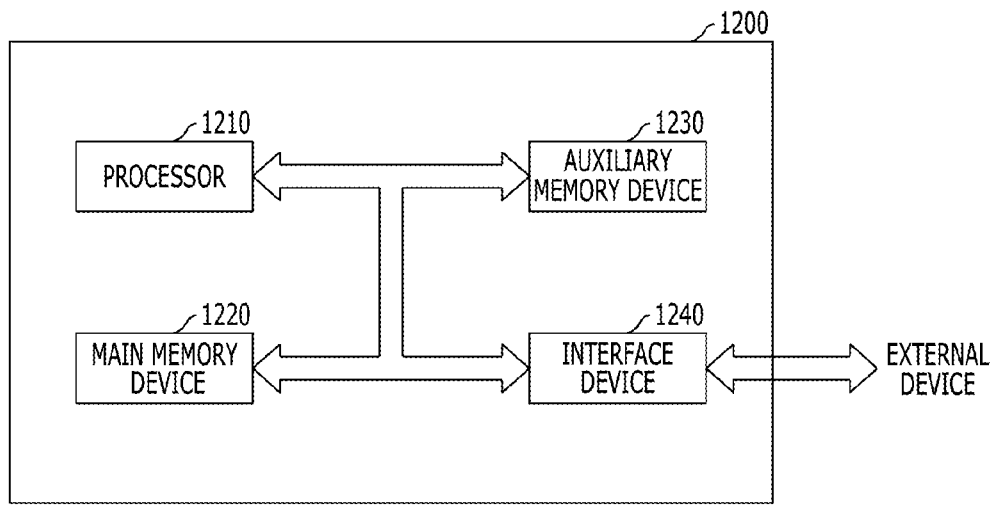
FIG. 13 is an example of configuration diagram of a system implementing memory circuitry based on the disclosed technology.

FIG. 13 is an example of configuration diagram of a system implementing memory circuitry based on the disclosed technology.

Referring to FIG. 13, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include first to Nth coupling lines coupled to first ends of first to Nth memory cells, respectively, where N is a natural number of 3 or more; first to Nth spare lines coupled to first ends of first to Nth spare cells, respectively, wherein the first to Nth spare cells correspond to the first to Nth memory cells, respectively; a driving block for selectively driving the first to Nth coupling lines with a predetermined voltage; and a repair coupling block for selectively coupling the first to Nth coupling lines with the first to Nth spare lines according to whether any of the first to Nth memory cells is a failure memory cell or not, wherein the repair coupling block includes a fuse, the fuse including a gate commonly coupled to the first to Nth coupling lines, first to Nth junction regions coupled to the first to Nth spare lines, respectively, and a dielectric layer interposed between the gate and the first to Nth junction regions, and wherein a dielectric breakdown between the gate and each of the first to Nth junction regions is independently performed. Through this, an area of the main memory device 1220 may be reduced and a degree of integration of the main memory device 1220 may be improved. As a consequence, an area of the system 1200 may be reduced and a degree of integration of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include first to Nth coupling lines coupled to first ends of first to Nth memory cells, respectively, where N is a natural number of 3 or more; first to Nth spare lines coupled to first ends of first to Nth spare cells, respectively, wherein the first to Nth spare cells correspond to the first to Nth memory cells, respectively; a driving block for selectively driving the first to Nth coupling lines with a predetermined voltage; and a repair coupling block for selectively coupling the first to Nth coupling lines with the first to Nth spare lines according to whether any of the first to Nth memory cells is a failure memory cell or not, wherein the repair coupling block includes a fuse, the fuse including a gate commonly coupled to the first to Nth coupling lines, first to Nth junction regions coupled to the first to Nth spare lines, respectively, and a dielectric layer interposed between the gate and the first to Nth junction regions, and wherein a dielectric breakdown between the gate and each of the first to Nth junction regions is independently performed. Through this, an area of the auxiliary memory device 1230 may be reduced and a degree of integration of the auxiliary memory device 1230 may be improved. As a consequence, an area of the system 1200 may be reduced and a degree of integration of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 14) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 14:
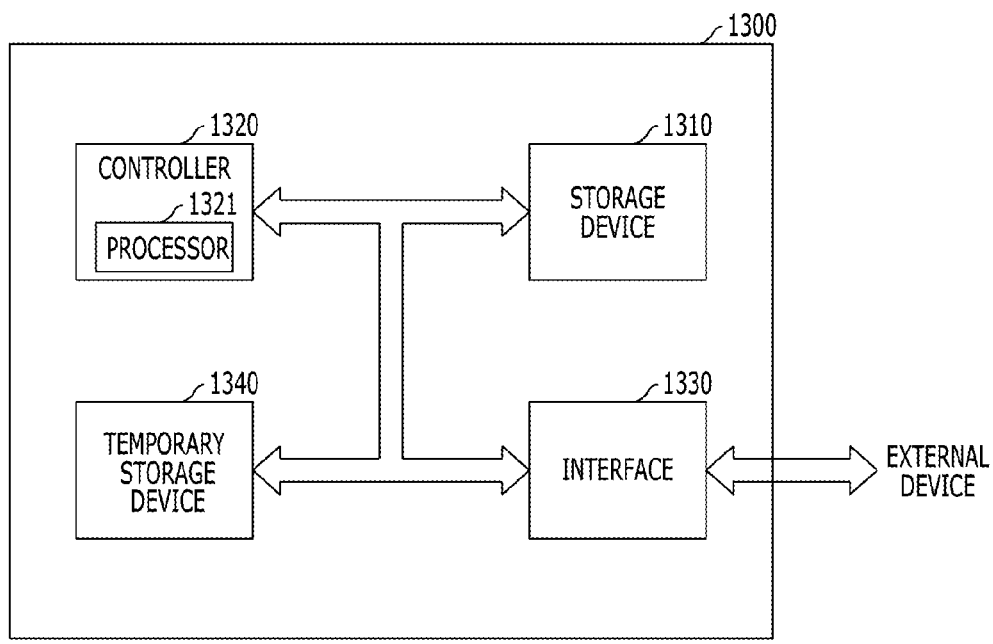
FIG. 14 is an example of configuration diagram of a data storage system implementing memory circuitry based on the disclosed technology.

FIG. 14 is an example of configuration diagram of a data storage system implementing memory circuitry based on the disclosed technology.

Referring to FIG. 14, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC)

card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include first to Nth coupling lines coupled to first ends of first to Nth memory cells, respectively, where N is a natural number of 3 or more; first to Nth spare lines coupled to first ends of first to Nth spare cells, respectively, wherein the first to Nth spare cells correspond to the first to Nth memory cells, respectively; a driving block for selectively driving the first to Nth coupling lines with a predetermined voltage; and a repair coupling block for selectively coupling the first to Nth coupling lines with the first to Nth spare lines according to whether any of the first to Nth memory cells is a failure memory cell or not, wherein the repair coupling block includes a fuse, the fuse including a gate commonly coupled to the first to Nth coupling lines, first to Nth junction regions coupled to the first to Nth spare lines, respectively, and a dielectric layer interposed between the gate and the first to Nth junction regions, and wherein a dielectric breakdown between the gate and each of the first to Nth junction regions is independently performed. Through this, an area of the storage device 1310 or the temporary storage device 1340 may be reduced and a degree of integration of the storage device 1310 or the temporary storage device 1340 may be improved. As a consequence, an area of the data storage system 1300 may be reduced and a degree of integration of the data storage system 1300 may be improved.

Figure 15:
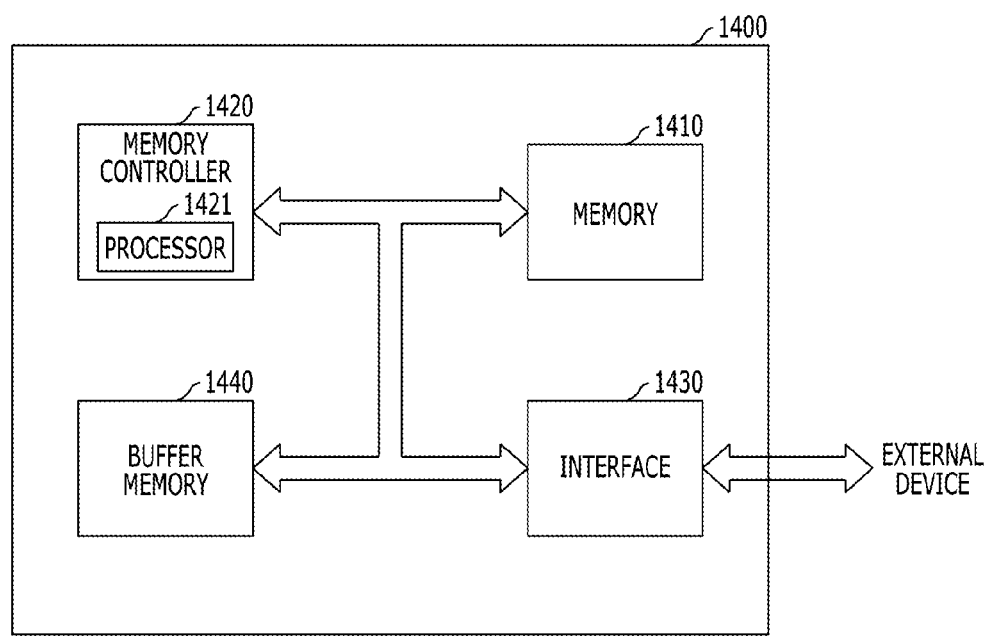
FIG. 15 is an example of configuration diagram of a memory system implementing memory circuitry based on the disclosed technology.

FIG. 15 is an example of configuration diagram of a memory system implementing memory circuitry based on the disclosed technology.

Referring to FIG. 15, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include first to Nth coupling lines coupled to first ends of first to Nth memory cells, respectively, where N is a natural number of 3 or more; first to Nth spare lines coupled to first ends of first to Nth spare cells, respectively, wherein the first to Nth spare cells correspond to the first to Nth memory cells, respectively; a driving block for selectively driving the first to Nth coupling lines with a predetermined voltage; and a repair coupling block for selectively coupling the first to Nth coupling lines with the first to Nth spare lines according to whether any of the first to Nth memory cells is a failure memory cell or not, wherein the repair coupling block includes a fuse, the fuse including a gate commonly coupled to the first to Nth coupling lines, first to Nth junction regions coupled to the first to Nth spare lines, respectively, and a dielectric layer interposed between the gate and the first to Nth junction regions, and wherein a dielectric breakdown between the gate and each of the first to Nth junction regions is independently performed. Through this, an area of the memory 1410 may be reduced and a degree of integration of the memory 1410 may be improved. As a consequence, an area of the memory system 1400 may be reduced and a degree of integration of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include first to Nth coupling lines coupled to first ends of first to Nth memory cells, respectively, where N is a natural number of 3 or more; first to Nth spare lines coupled to first ends of first to Nth spare cells, respectively, wherein the first to Nth spare cells correspond to the first to Nth memory cells, respectively; a driving block for selectively driving the first to Nth coupling lines with a predetermined voltage; and a repair coupling block for selectively coupling the first to Nth coupling lines with the first to Nth spare lines according to whether any of the first to Nth memory cells is a failure memory cell or not, wherein the repair coupling block includes a fuse, the fuse including a gate commonly coupled to the first to Nth coupling lines, first to Nth junction regions coupled to the first to Nth spare lines, respectively, and a dielectric layer interposed between the gate and the first to Nth junction regions, and wherein a dielectric breakdown between the gate and each of the first to Nth junction regions is independently performed. Through this, an area of the buffer memory 1440 may be reduced and a degree of integration of the buffer memory 1440 may be improved. As a consequence, an area of the memory system 1400 may be reduced and a degree of integration of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 11-15 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document

What is claimed is:

1. A fuse element comprising:
   a gate;
   first to Nth junction regions disposed in an active region, where N is a natural number of 3 or more; and
   a dielectric layer interposed between the gate and the first to Nth junction regions,
   wherein a dielectric breakdown between the gate and each of the first to Nth junction regions is independently performed, and
   wherein the gate has a polygonal shape which has N numbers of sides overlapping with the active region, and the first to Nth junction regions are disposed in the active region to correspond to the N numbers of sides, respectively.

2. The fuse element of claim 1, wherein the polygonal shape is a concave polygonal shape or a convex polygonal shape.

3. The fuse element of claim 1, wherein at least a portion of the gate laterally protrudes out of the active region in a plan view and is disposed over the active region.

4. The fuse element of claim 1, further comprising:
   N numbers of first switches having first ends which are coupled to the first to Nth junction regions, respectively.

5. The fuse element of claim 4, further comprising:
   N numbers of second switches having first ends coupled to second ends of the N numbers of first switches, respectively, and second ends coupled to a ground voltage end.

6. An electronic device comprising a semiconductor memory, wherein the semiconductor memory includes:
   first to Nth coupling lines coupled to first ends of first to Nth memory cells, respectively, where N is a natural number of 3 or more;
   first to Nth spare lines coupled to first ends of first to Nth spare cells, respectively, wherein the first to Nth spare cells correspond to the first to Nth memory cells, respectively;
   a driving block for selectively driving the first to Nth coupling lines with a predetermined voltage; and
   a repair coupling block for selectively coupling the first to Nth coupling lines with the first to Nth spare lines according to whether any of the first to Nth memory cells is a failure memory cell or not,
   wherein the repair coupling block includes a fuse, the fuse including a gate commonly coupled to the first to Nth coupling lines, first to Nth junction regions coupled to the first to Nth spare lines, respectively, and a dielectric layer interposed between the gate and the first to Nth junction regions,
   wherein a dielectric breakdown between the gate and each of the first to Nth junction regions is independently performed, and
   wherein the gate has a polygonal shape which has N numbers of sides overlapping with an active region, and the first to Nth junction regions are disposed in the active region to correspond to the N numbers of sides, respectively.

7. The electronic device of claim 6, wherein the polygonal shape is a concave polygonal shape or a convex polygonal shape.

8. The electronic device of claim 6, wherein at least a portion of the gate laterally protrudes out of the active region in a plan view and is disposed over the active region.

9. The electronic device of claim 6, wherein, when a Tth memory cell of the first to Nth memory cells is a failure memory cell, the repair coupling block couples a Tth coupling line with a Tth spare line by causing a dielectric breakdown between the gate and a Tth junction region, where T is a natural number in a range of 1 to N.

10. The electronic device of claim 9, wherein the repair coupling block further includes first to Nth switches coupled to and disposed between the first to Nth junction regions and the first to Nth spare lines, respectively, and wherein, when the Tth memory cell is selected after the dielectric breakdown occurs between the gate and the Tth junction region, a Tth switch is turned on.

11. The electronic device of claim 9, wherein the repair coupling block further includes N numbers of first switches coupled to and disposed between the first to Nth junction regions and the first to Nth spare lines, respectively, and N numbers of second switches having first ends each coupled to and disposed between a corresponding one of the first to Nth spare lines and a corresponding one of the first to Nth switches and second ends coupled to a ground voltage end, and wherein, while the dielectric breakdown occurs between the gate and the Tth junction region, a Tth first switch and a Tth second switch are turned on.

12. The electronic device of claim 6, wherein the semiconductor memory further includes:

first to Nth additional coupling lines coupled to second ends of the first to Nth memory cells, respectively, and extending in a direction which crosses an extending direction of the first to Nth coupling lines;

first to Nth additional spare lines coupled to second ends of the first to Nth spare cells, respectively, and extending in a direction which crosses an extending direction of the first to Nth spare lines;

an additional driving block for driving the first to Nth additional spare lines with a predetermined voltage; and an additional repair coupling block for selectively coupling the first to Nth additional coupling lines with the first to Nth additional spare lines according to whether any of the first to Nth memory cells is a failure memory cell or not.

13. The electronic device of claim 12, wherein, when a Tth memory cell of the first to Nth memory cells is a failure memory cell, the additional repair coupling block blocks a connection between a Tth additional coupling line and a Tth additional spare line, where T is a natural number in a range of 1 to N.

14. The electronic device of claim 13, wherein the additional repair coupling block further includes first to Nth additional switches coupled to and disposed between the first to Nth additional coupling lines and the first to Nth additional spare lines, respectively, and wherein, when the Tth memory cell is selected, a Tth additional switch is turned off.

15. The electronic device of claim 6, wherein each of the first to Nth memory cells and the first to Nth spare cells includes a variable resistance element which switches between different resistance states according to a voltage or current supplied thereto through a corresponding one of the first to Nth coupling lines and a corresponding one of the first to Nth additional coupling lines.

16. The electronic device according to claim 6, further comprising a microprocessor which includes:

a control unit configured to receive a signal including a command from an outside of the microprocessor, and performs extracting, decoding of the command, or controlling input or output of a signal of the microprocessor;

an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

17. The electronic device according to claim 6, further comprising a processor which includes:

a core unit configured to perform, based on a command inputted from an outside of the processor, an operation corresponding to the command, by using data;

a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

18. The electronic device according to claim 6, further comprising a processing system which includes:

a processor configured to decode a command received by the processor and control an operation for information based on a result of decoding the command;

an auxiliary memory device configured to store a program for decoding the command and the information;

a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

19. The electronic device according to claim 6, further comprising a data storage system which includes:

a storage device configured to store data and conserve stored data regardless of power supply;

a controller configured to control input and output of data to and from the storage device according to a command inputted form an outside;

a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

20. The electronic device according to claim 6, further comprising a memory system which includes:

a memory configured to store data and conserve stored data regardless of power supply;

a memory controller configured to control input and output of data to and from the memory according to a command inputted form an outside;

a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

21. An electronic device comprising a semiconductor memory, wherein the semiconductor memory comprises:

a plurality of coupling lines electrically coupled to memory cells, respectively;

a plurality or spare lines electrically coupled to spare cells, respectively; and a repair coupling block to selectively couple the coupling lines to the spare lines, wherein the repair coupling block includes a plurality of fuse structures, and wherein each of the fuse structures includes:

a gate electrode disposed on an active region and commonly coupled to the coupling lines;

at least three junction regions formed in the active region and electrically coupled to the spare lines, respectively; and a gate dielectric layer interposed between the gate electrode and the at least three junction regions, wherein the gate electrode has a polygonal shape including at least three edges in a plan view.

22. The electronic device of claim 21, wherein the at least three junction regions are disposed to correspond to the at least three edges of the gate electrode, respectively.

* * * * *